(12) United States Patent
Sarraju et al.

(10) Patent No.: US 9,147,463 B1
(45) Date of Patent: Sep. 29, 2015

(54) METHOD AND APPARATUS FOR DATA CAPTURE IN DDR MEMORY INTERFACE

(71) Applicant: MegaChips Corporation, Osaka (JP)

(72) Inventors: Dinakar Venkata Sarraju, Bangalore (IN); Purushotham Brahmavar Ramakrishna, Bangalore (IN)

(73) Assignee: MegaChips Corporation, Osaka (JP)

( * ) Notice: Subject to any disclaimer, the term of this patent is extended or adjusted under 35 U.S.C. 154(b) by 16 days.

(21) Appl. No.: 14/224,115

(22) Filed: Mar. 25, 2014

(51) Int. Cl.
*G11C 7/00* (2006.01)
*G11C 11/4076* (2006.01)
*G11C 11/409* (2006.01)

(52) U.S. Cl.
CPC .......... *G11C 11/4076* (2013.01); *G11C 11/409* (2013.01)

(58) Field of Classification Search
CPC ............ G11C 8/18; G11C 29/02; G11C 29/12
USPC ................. 365/193, 233.11, 233.13
See application file for complete search history.

(56) References Cited

U.S. PATENT DOCUMENTS

| | | | |
|---|---|---|---|
| 6,229,759 B1 | 5/2001 | Morgan | |
| 7,198,197 B2 | 4/2007 | Best | |
| 7,679,986 B2 | 3/2010 | Lee | |
| 8,299,948 B2 | 10/2012 | Shibasaki et al. | |
| 2011/0273215 A1* | 11/2011 | Gupta | 327/298 |
| 2014/0375365 A1* | 12/2014 | Liu | 327/141 |

* cited by examiner

Primary Examiner — Han Yang
(74) Attorney, Agent, or Firm — Osha Liang LLP

(57) ABSTRACT

A method for data acquisition in a memory system includes oversampling a data signal and a strobe signal with a multiphase clock having n phases to generate a series of data signals and a series of strobe signals representing a first data series and a first strobe series respectively, generating a second strobe series by edge detection of the first strobe series followed by retiming of the edge detected series, generating a third strobe series by edge adjustment of the second strobe series, wherein the edge adjustment ensures that there are no overlapping edges among the signals of the third strobe series, generating a sample selected series by linear shifting of each signal of the third strobe series by n/2, generating a second data series by retiming the first data series, generating a third data series by sample adjustment of the second data series, wherein the sample adjustment ensures that the third data series is in synchronization with a sampling window of the sample selected series, and determining a final data signal by multiplexing the third data series with the sample selected series.

26 Claims, 18 Drawing Sheets

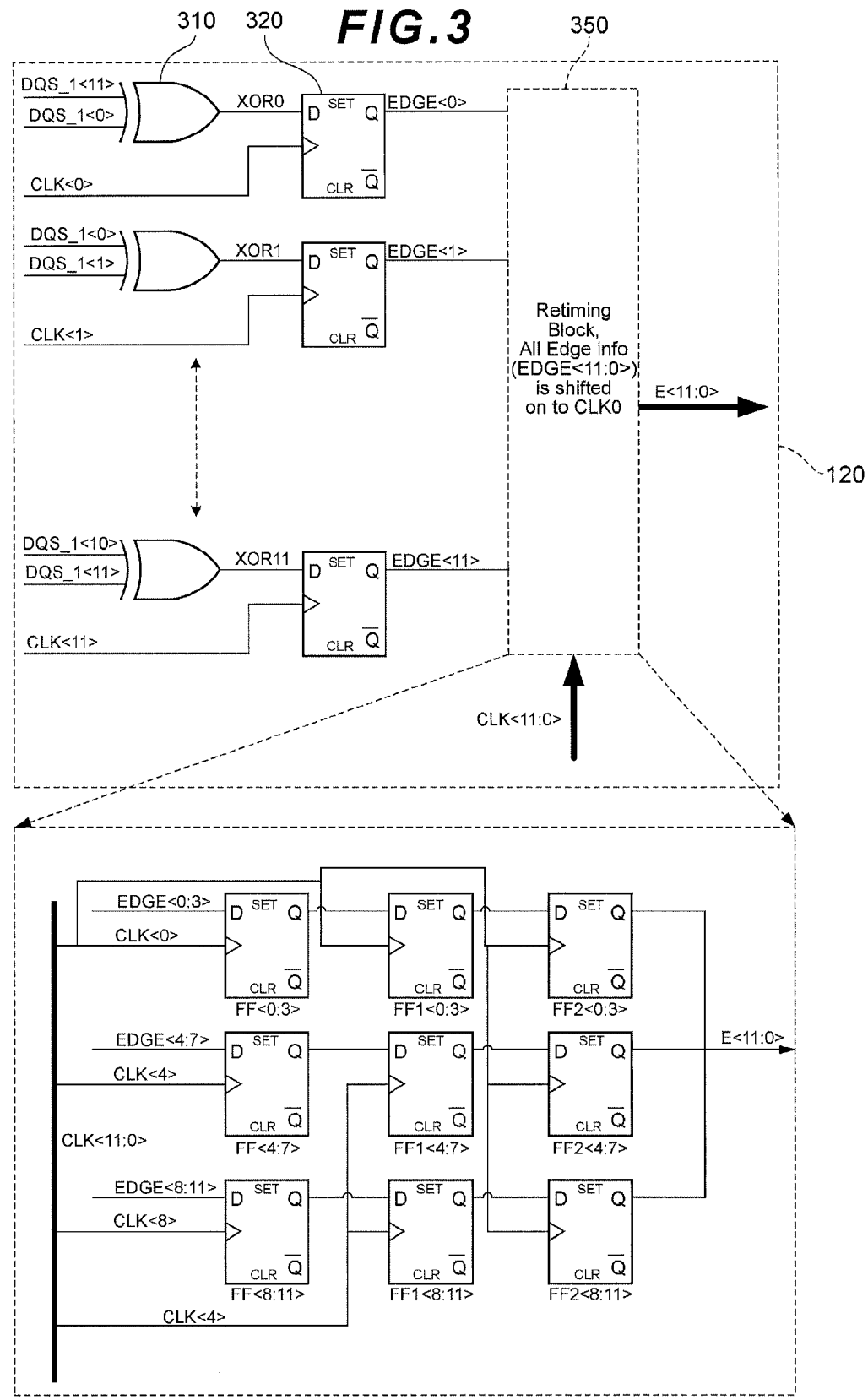

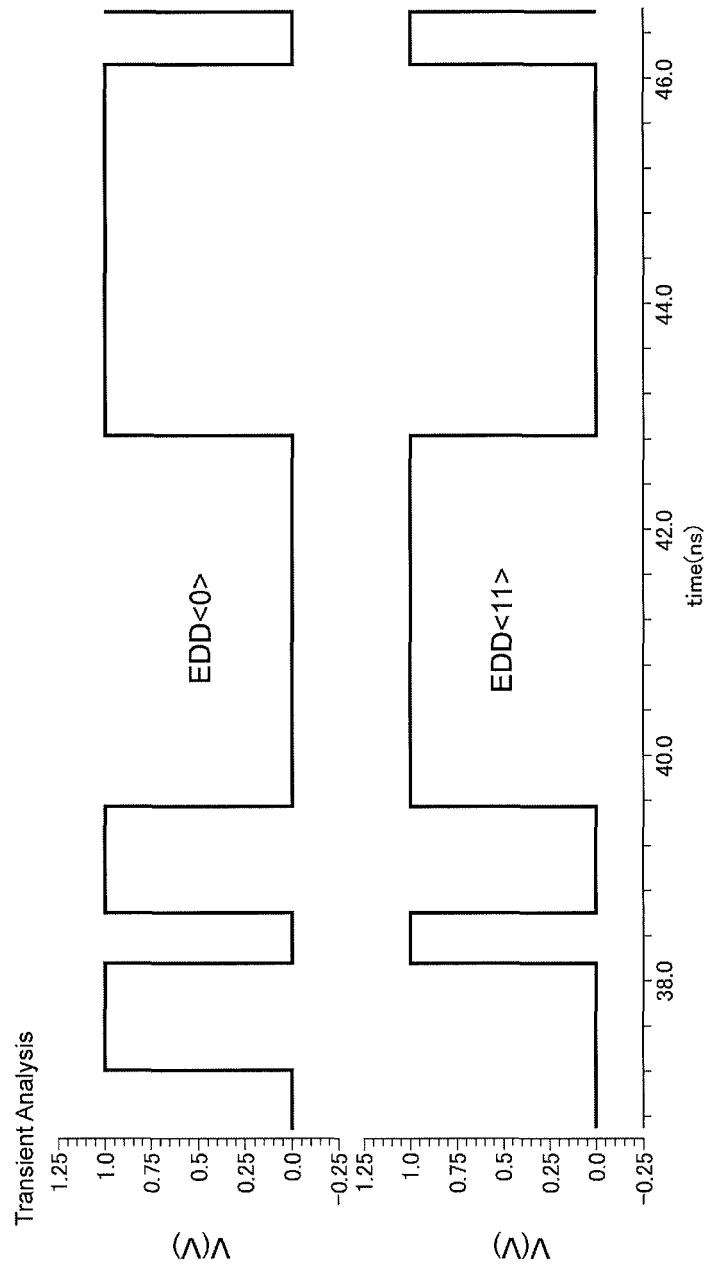

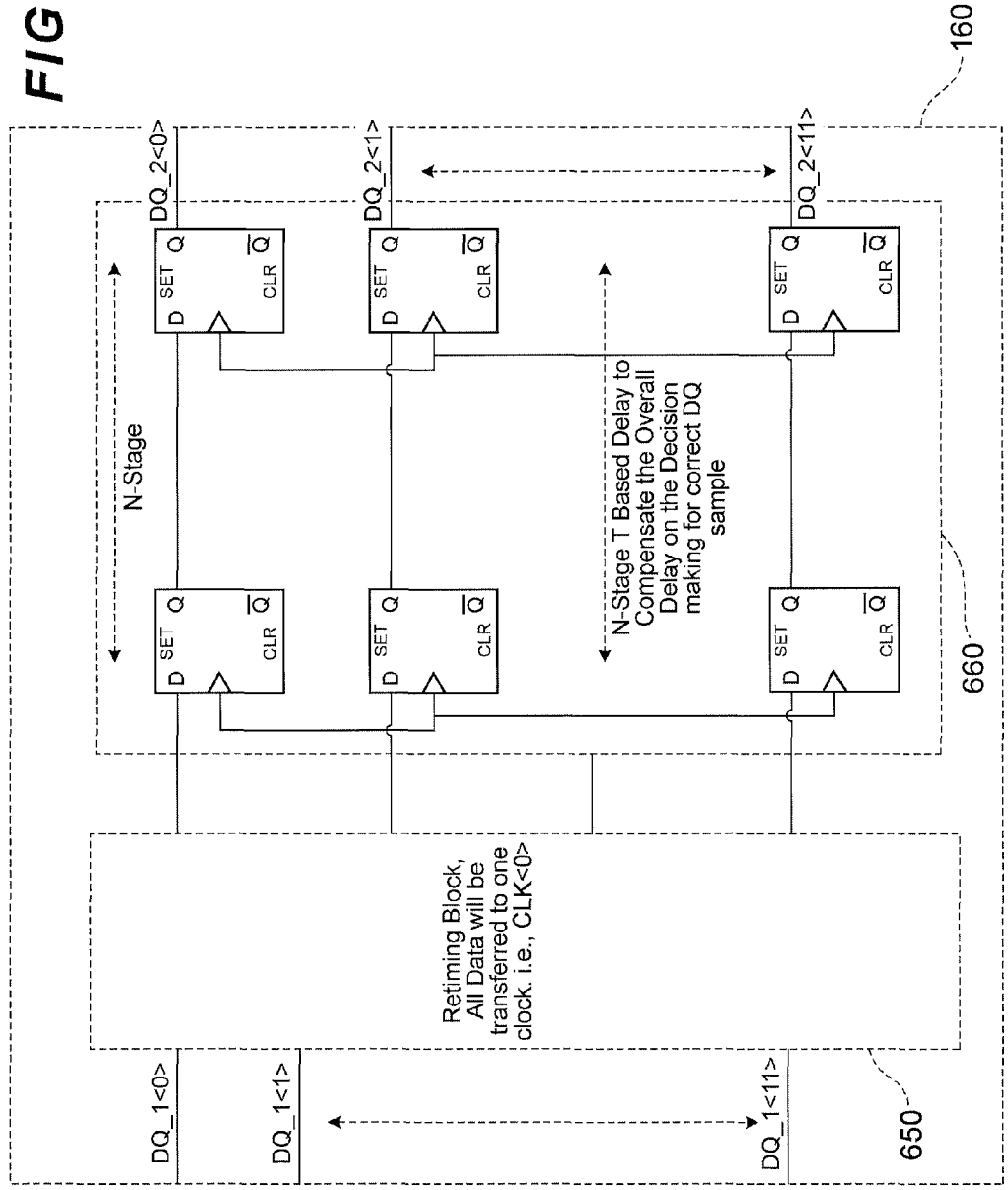

METHOD AND APPARATUS FOR DATA CAPTURE IN DDR MEMORY INTERFACE

FIELD OF THE INVENTION

The present disclosure generally relates to a method and apparatus for data acquisition in an electronic system. More particularly, the present disclosure relates to reading of data (DQ) bits, from a Double Data Rate (DDR) memory in a DDR memory interface, and specifically by a PHY (physical interface) thereof.

BACKGROUND OF THE INVENTION

Digital electronics systems and computer systems generally employ a memory subsystem that includes memory devices interfaced to one or more processors/controllers that perform read-write function on the memory devices. Because the speed of operation of processors/controllers is higher than that of the memory subsystem, the operation speeds of such a memory subsystem can always be improved so as to enhance the overall performance of the system.

One of the approaches for improving performance is the use of DDR SDRAM memory devices. The DDR SDRAM enables data to be read and written on both rising and falling edges of the clock cycles, thereby effectively doubling the rate of operation and enhancing performance.

In a DDR memory system, READ and WRITE modes are performed using a data strobe signal (DQS) and a data signal (DQ). The DQS must be aligned at the center of the DQ for successful detection of data. In the WRITE mode, the DQS and the DQ are both sent by an SDRAM PHY such that the DQS is aligned at the center of the DQ while performing the WRITE operation.

However, in the READ mode, because the DQS is not aligned at the center with respect to the data, the DDR PHY (or the memory controller) is required to shift the DQS to the center of the DQ. In a conventional technique, such shifting is normally performed by using a Master-Slave Delay Locked Loop (DLL). A typical configuration of the Master-Slave DLL for shifting the DQS is shown in, for example, FIG. 15. Particularly, a DQS signal is shifted using a Master-Slave DLL and the shifted DQS is then used for capturing the DQ, as shown in FIG. 15. However, the use of such a DLL not only requires additional hardware (such as FIFO circuitry), but also, causes substantial jitters and/or on-chip variations. The use of such a DLL makes it difficult to capture the correct data signal and, thus, is not desirable.

U.S. Pat. Nos. 6,229,759 and 7,679,986 disclose systems for performing WRITE operation on a memory. However, these patents do not solve the problem of capturing the DQ in the READ mode where the DQS is not aligned at the center of the DQ. Further, in the '759 Patent, the DQS is used as a synchronizing signal such that the DQ is sampled with the DQS. However, synchronizing DQ with the DQS requires separating rising and falling edges of the DQS, which requires additional circuitry and logic implementation.

U.S. Pat. No. 8,299,948 discloses a scheme of data capturing using a multiphase clock generating circuit that is required for every bit of data. Such a data capturing scheme is not suitable for a DDR system because it requires 'k' number of multiphase clock generating circuits for a k-bit word length memory. Such a scheme not only adds to the circuit area, but also, consumes a lot of power.

One way of extracting the correct DQ sample without using the Master-Slave DLL is discussed in U.S. Pat. No. 7,198,197. This patent discloses how the DQ and the DQS are to be oversampled with a clock signal having a frequency 'X' times that of the system clock, where X is an integer. Upon oversampling, this patent employs a method for extraction of correct data on the basis of a defined bit boundary range (BBR). Particularly, the '197 Patent recites a voting scheme on the basis of values of the DQS to determine the DQ. However, the use of this voting scheme also consumes a lot of power and requires a large area on the circuit.

Therefore, even upon implementing such a scheme for data capturing, there still remains an unfulfilled need of capturing correct data with reduced circuitry, power consumption, and area requirements.

In view of the above, there exists a need for data recovery at the DDR PHY in the READ mode in a manner that improves timing margins and substantially reduces jitters and/or distortions. Further, there exists a need for data recovery in a manner that reduces the "overheads," such as circuit area requirements and power consumption.

SUMMARY OF THE INVENTION

One or more embodiments of the present disclosure provide a method and device for data acquisition in a memory system for reading data (DQ) bits by an SDRAM controller from a DDR memory. One or more embodiments of the present disclosure may address duty distortion, jitter, etc. as well as may decrease circuit area and/or power.

One or more embodiments of the present disclosure provide a method for data acquisition in a memory system. The method may include receiving a data signal and a strobe signal; oversampling the data signal and the strobe signal with a multiphase clock having n phases to generate a series of data signals and a series of strobe signals representing a first data series and a first strobe series, respectively; generating a second strobe series by edge detection of the first strobe series followed by retiming of the edge detected series; generating a third strobe series by edge adjustment of the second strobe series, wherein the edge adjustment ensures that there are no overlapping edges among the signals of the third strobe series; generating a sample selected series by linear shifting each signal of the third strobe series by n/2; generating a second data series by retiming the first data series; generating a third data series by sample adjustment of the second data series, wherein the sample adjustment ensures that the third data series is in synchronization with a sampling window of the sample selected series; and determining a final data signal by multiplexing the third data series with the sample selected series.

One or more embodiments of the present disclosure provide a device for data acquisition in a memory system. The device may include a DDR IO block configured to receive a strobe signal and a data signal from memory; an oversampling circuit configured to oversample the strobe signal and the data signal with a multiphase clock having N phases to generate a first strobe series and first data series respectively; an edge detector circuit configured to detect the edge information of the first strobe series and perform retiming thereof to generate a second strobe series; an edge adjuster circuit configured to adjust edge of the second strobe series to generate a third strobe series; a sample selector circuit configured to map the third strobe series to generate a sample selected series; a retiming circuit configured to perform returning of the first data series to generate a second data series; a sample adjuster circuit configured to adjust the sampling window of the second data series to generate a third data series; a data selector circuit configured to multiplex the sample selected series and the third data signal to generate a final data signal, wherein the edge adjuster circuit and the sample adjuster circuit performs the adjustment to ensure that there are no overlapping edges in the third strobe series and the third data series respectively, and wherein the sample selector circuit generates the sample selected series by linear shifting of each signal of the third strobe series by N/2.

One or more embodiments of the present disclosure provide a method for performing read operation in a DDR memory system. The method may include receiving a data signal and a strobe signal at a DDR PHY; oversampling the data signal and the strobe signal with a multiphase clock having N phases to generate a series of data signals and a series of strobe signals representing a first data series and a first strobe series respectively; generating a second strobe series by edge detection of the first strobe series followed by retiming of the edge detected series, wherein the edge detection is performed by an XOR operation on consecutive signals of the first strobe series and retiming is performed to retime all the signals of a series to a particular phase of the multiphase clock; generating a third strobe series by edge adjustment of the second strobe series, wherein the edge adjustment ensures that there are no overlapping edges among the signals of the third strobe series; offsetting the signals of the third strobe series to compensate for a mismatch among individual bits of the data signal, wherein the offset is calculated by performing edge detection of the oversampled data signal and the oversampled strobe signal and determining a difference between the edge detected data and the edge detected strobe signal; generating a sample selected series by linear shifting of each signal of the third strobe series by n/2, wherein the linear shifting maps each signal of the third strobe series to a corresponding middle signal upon shifting by n/2; generating a second data series by retiming and delaying the first data series, wherein the retiming is performed to retime all the signals of a series to any phase of the multiphase clock; generating a third data series by sample adjustment of the second data series, wherein the sample adjustment ensures that the third data series is in synchronization with a sampling window of the sample selected series; and determining a final data signal by multiplexing the third data series with the sample selected series.

These as well as other aspects and advantages of the present disclosure will become more apparent to those of ordinary skill in the art by reading the following detailed description, with reference to the accompanying drawings.

BRIEF DESCRIPTION OF THE DRAWINGS

One or more embodiments of the present disclosure are described with reference to the accompanying drawings, in which:

FIG. 3 is a circuit diagram of an edge detector block of a DDR PHY according to one or more embodiments of the present disclosure;

FIG. 5b is a timing diagram of output signals of an edge adjuster block according to one or more embodiments of the present disclosure;

FIG. 6 is a circuit diagram of a T-based delay circuit of a DDR PHY according to one or more embodiments of the present disclosure;

DETAILED DESCRIPTION

The present disclosure relates to a unique technique of reading of data (DQ) bits in a memory system by an SDRAM controller from a memory, such as a DDR memory that avoids jitters and on-chip variations, which, in turn, reduces the timing margins. According to one or more embodiments described hereinafter, the DDR memory and the SDRAM controller, along with SDRAM PHY have been described as independent devices in the memory system; however, one of ordinary skill in the art would appreciate that they may be on a single chip or on a plurality of independent chips that are interfaced together to communicate with one another. Further, while the embodiments of the disclosure hereinafter are shown for DDR memory systems, the same is not limited to the described embodiments and could be equally applied to any other single or multi-chip memory systems.

Figure 1:
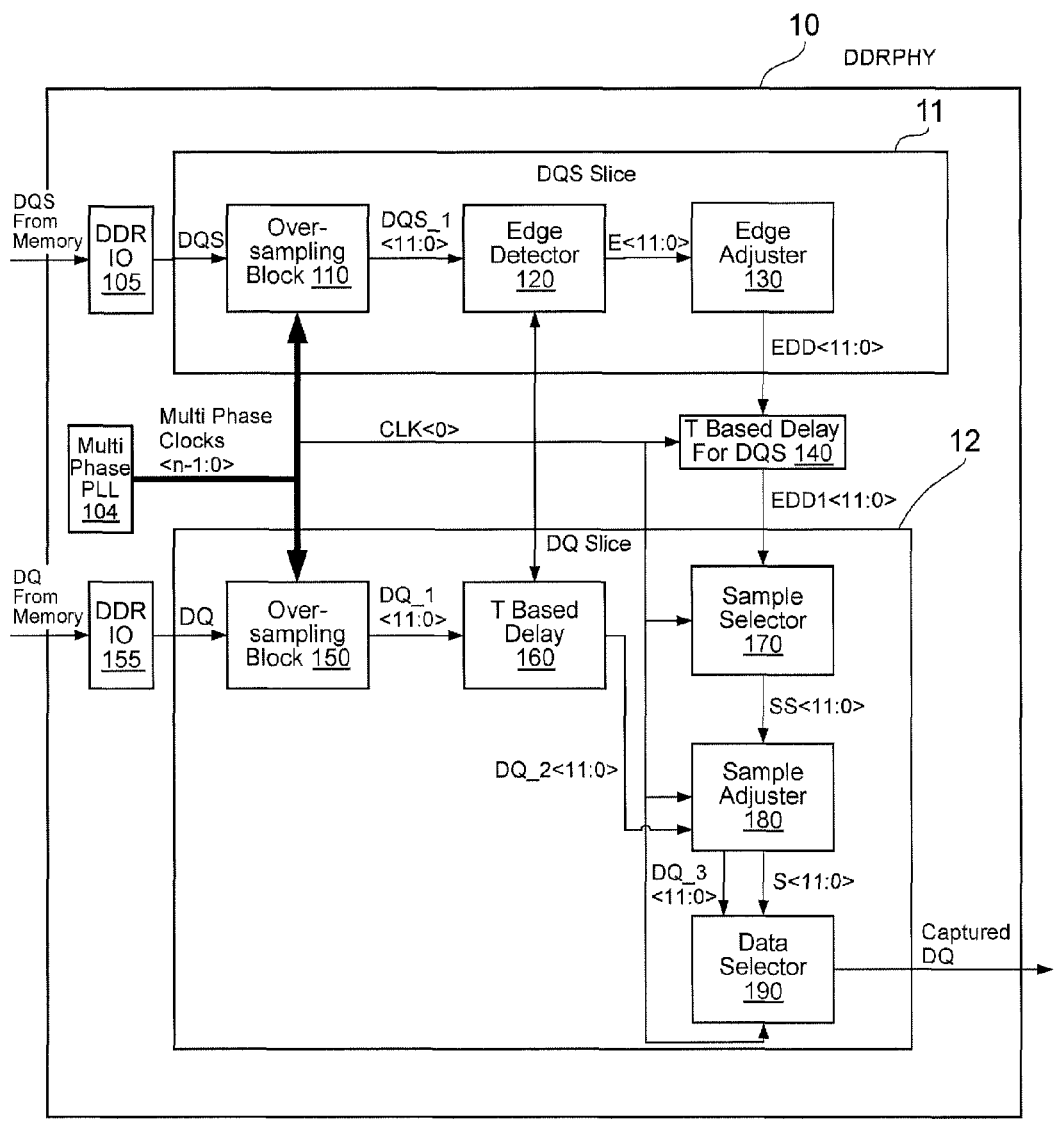
FIG. 1 is a functional block diagram of a DDR PHY of a memory system according to one or more embodiments of the present disclosure.

FIG. 1 is a functional block diagram of a DDR PHY 10 of the memory system (not shown in its entirety) according to one or more embodiments of the present disclosure. The embodiment shown represents the DDR PHY 10 as a separate element interfaced to the SDRAM controller (not shown). Alternatively, the DDR PHY 10 may directly be configured within the SDRAM controller. The present disclosure envisages that the DDR PHY 10 may include a multiphase clock CLK<n−1:0> generated by a multiphase PLL 104 or any other suitable arrangement of generating multiphase clock signals. For the purposes of illustration only, n has been considered to be 12 and, in the ensuing description, n and 12 may be used interchangeably. However, the present disclosure should not be construed to be limited by this particular value of n. Further, the DDR PHY 10 may comprise two sub blocks, e.g., a DQS slice 11 and a DQ slice 12, that process a data strobe signal DQS (hereinafter the "DQS signal") and a data signal DQ (hereinafter the "DQ signal"), respectively, received from the DDR memory (not shown). The size of the DQ signal may be 4, 8, 16, 32 bits and so on, depending on the word length of the memory system.

According to one or more embodiments of the present disclosure, the DQS slice 11 may perform the processing of the DQS signal. Particularly, the DQS signal from the DDR memory may be received at a DDR IO block 105 and may be oversampled by an oversampling block 110. The oversampled DQS signal may represent a first strobe series having 'n' strobe signals depicted as DQS_1<n−1:0> in FIG. 1. The oversampled DQS may then be sent to an edge detector 120 that detects edges in the DQS signal. The detected edges may be adjusted by an edge adjuster block 130. The edge adjusted signal may then be sent to a sample selector block 170 that selects the appropriate samples for capturing correct data. According to one or more embodiments of the present disclosure, the sample selector block 170 and subsequent blocks have been shown to be configured within the DQ slice 12; however, the present disclosure is not limited to the described configuration and the sample selector block 170 (and subsequent blocks) may be implemented in the DQS slice 11 as well.

Further, the DQ slice 12 may perform processing of the DQ signal. For example, the DQ signal from the DDR memory may be received at a DDR IO block 155 and may be oversampled by an oversampling block 150 to output a series of oversampled DQ signals DQ_1<n−1:0> represented as a first data series. The first data series, may then be time delayed by a T based delay block 160 so as to delay each DQ signal of the first data series by appropriate time duration corresponding to the time required to process and determine the appropriate DQS signal. A sample adjuster block 180 may then perform adjustment on the received time-delayed DQ signals to obtain sample adjusted DQ signals and send the adjusted DQ signals to a data selector block 190, which, in turn, may retrieve the correct DQ signal.

Figure 2:
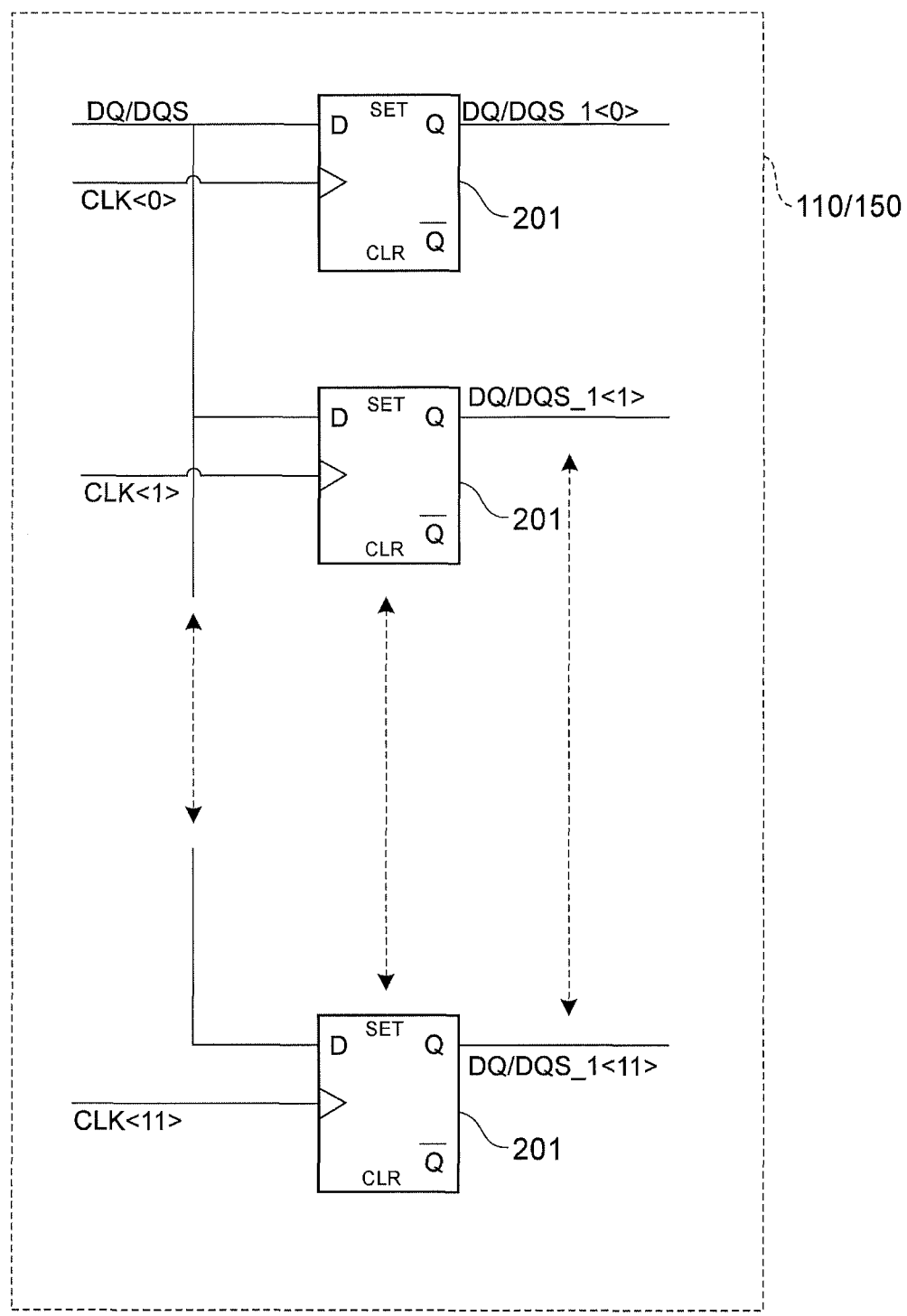
FIG. 2 is a circuit diagram of an oversampling block of a DDR PHY according to one or more embodiments of the present disclosure.
Figure 11A:
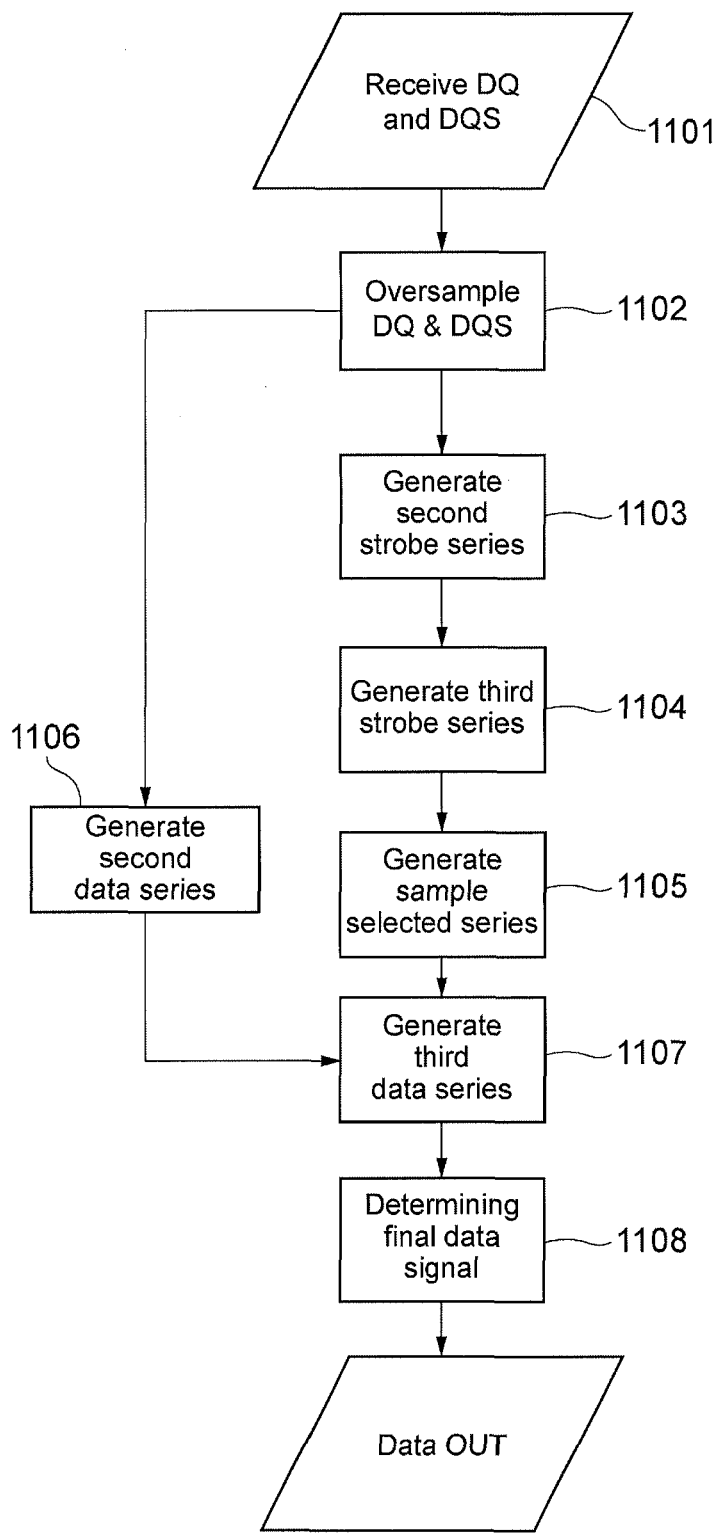
FIG. 11A is a flow diagram of a method for data acquisition in a memory system according to one or more embodiments of the present disclosure.

The working of one or more embodiments of the present disclosure and the various blocks of the block diagram would be apparent from the flow-chart illustrated in, for example, FIG. 11A. FIG. 11A pertains to a method for data capture in a memory system, as envisaged according to one or more embodiments of the present disclosure. The method may commence at 1101 with the DQ and DQS signals received at the DDR PHY 10, as explained above. The received DQ and DQS signals may be oversampled, at 1102, by the oversampling blocks 150 and 110, respectively. FIG. 2 is a circuit diagram for the oversampling block 110 according to one or more embodiments of the present disclosure. As shown, the oversampling block 110 may include a plurality of D flip-flops 201, the same as the number of clock phases 'n' of the multiphase clock. As mentioned earlier, for purposes of illustration only, n has been considered to be 12. Further, it should be noted that the oversampling block 150 may be configured to be similar to the oversampling block 110 and, thus, the configuration and working of the oversampling block 150 are not explained separately. Upon oversampling, the output of the oversampling block 110 may be the first strobe series DQS_1<n−1:0> having the series of 'n' DQS signals corresponding to 'n' clock phases, as described above. Likewise, the oversampling block 150 for the DQ signal may generate the first data series DQ_1<n−1:0>, as described. Also, it should be understood that for an 8-bit (k) word length of the DDR memory and with n=12 multiphase clock, the size of the DQ signal upon sampling will be k*n (e.g., 8*12=96) bits. Similarly, the number of bits of the DQS signal, upon oversampling, will be equal to 'n' (e.g., 12), as there is one DQS signal for a k-bit length DQ signal.

At 1103 in FIG. 11A, according to one or more embodiments of the present disclosure, edge detection may be performed on the first strobe series DQS_1<n−1:0> obtained at output of the oversampling block 110. Particularly, the edge detector block 120 may receive the first strobe series as input and generate a second strobe series as output. FIG. 3 is a circuit diagram for the edge detector block 120 according to one or more embodiments of the present disclosure. As shown, the edge detector 120 may include a plurality of XOR gates 310, each having an input as two consecutive oversampled DQS signals of the first strobe series. Particularly, in order to determine the rising and falling edges of the DQS_1<n−1:0> signals, each XOR gate 310 of the edge detector 120 may perform XOR operation on two consecutive signals of DQS<n−1:0> signals, as shown in, e.g., FIG. 3. The output of each of the XOR gate 310 may be given as an input to a corresponding D flip-flop 320. Each of the D flip-flop 320 is driven by a respective clock of the multiphase clock CLK<n−1:0>, as shown in, e.g., FIG. 3, for detecting a corresponding edge signal. The output obtained after XOR operation of the consecutive signals of DQS_1<n−1:0> and a subsequent detection by D flip-flops 320 may be a series of edge detected signals EDGE<n−1:0>. Further, according to one or more embodiments of the present disclosure, all edge detected signals EDGE<n−1:0> may be with reference to the n different clock phases and, thus, after performing the XOR operation, the series of edge detected signal EDGE<n−1:0> may be retimed by a retiming block 350 so as to conform to the same clock, such as CLK<0>, of the multiphase clock. The retiming block 350 may perform the retiming by shifting each of the edge detected signals EDGE<n−1:0> in time to the same clock phase. The shifting in time may ensure that all the edge detected signals are in time synchronism with respect to one another. The retiming block 350 has been illustrated in, e.g., FIG. 3. The retiming block 350 may perform the retiming using stages of flip flops. As shown in, e.g., FIG. 3, the edge detected signal EDGE<n−1:0> may be time-shifted (retimed) on the basis of prominent clocks CLK0, CLK4 and CLK8 from the multiphase clock CLK<n−1:0> and three stages of the D flip-flops arranged in the retiming block 350. The output of the retiming block 350 may be a series of edge detected signals E<n−1:0> retimed to CLK<0> according to one or more embodiments of the present disclosure. The series of edge detected signals E<n−1:0> may be referred to as a second strobe series. According to one or more embodiments of the present disclosure, retiming of the signal may be made with respect to CLK<0>; however, the present disclosure is not limited to that and the signal may be, for example, retimed to any suitable clock phase of the multiphase clock. Also, it should be understood that the retiming block has been shown for three sets of clocks and three stages of the D flip-flops; however, in the actual implementation the number of clocks and the number of flip-flop stages used will depend on the actual SETUP & HOLD requirement of the D flip-flops. This retiming may be required in order to perform data selection with the correct signal, as explained later.

Figure 4A:
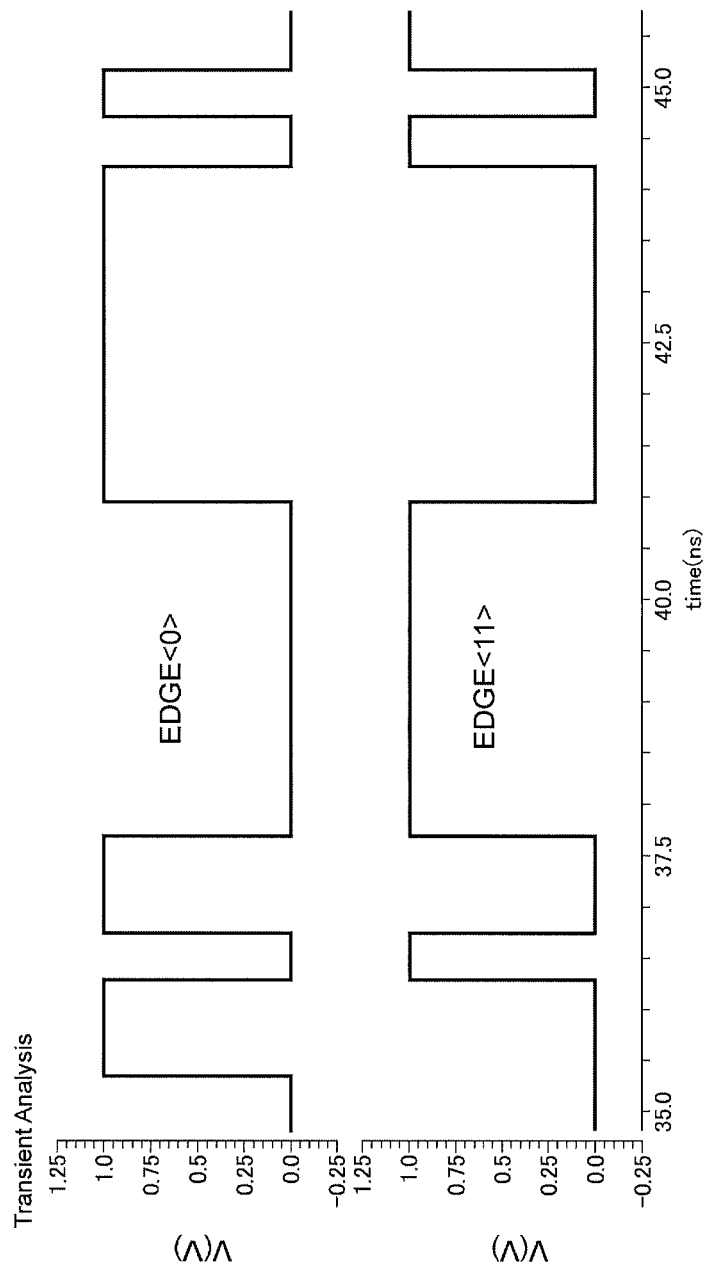
FIG. 4a is a timing diagram of EDGE signals within an edge detector block according to one or more embodiments of the present disclosure.
Figure 4B:
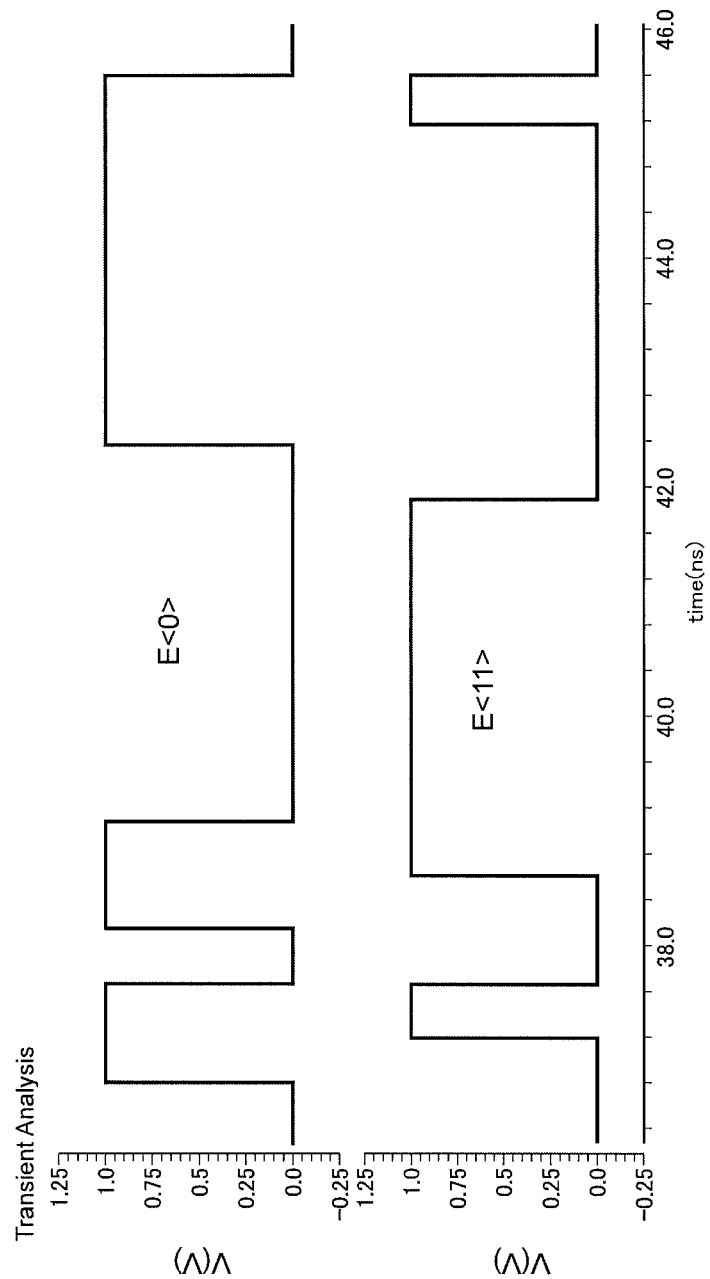
FIG. 4b is a timing diagram of output signals of an edge detector block according to one or more embodiments of the present disclosure.
Figure 11B:
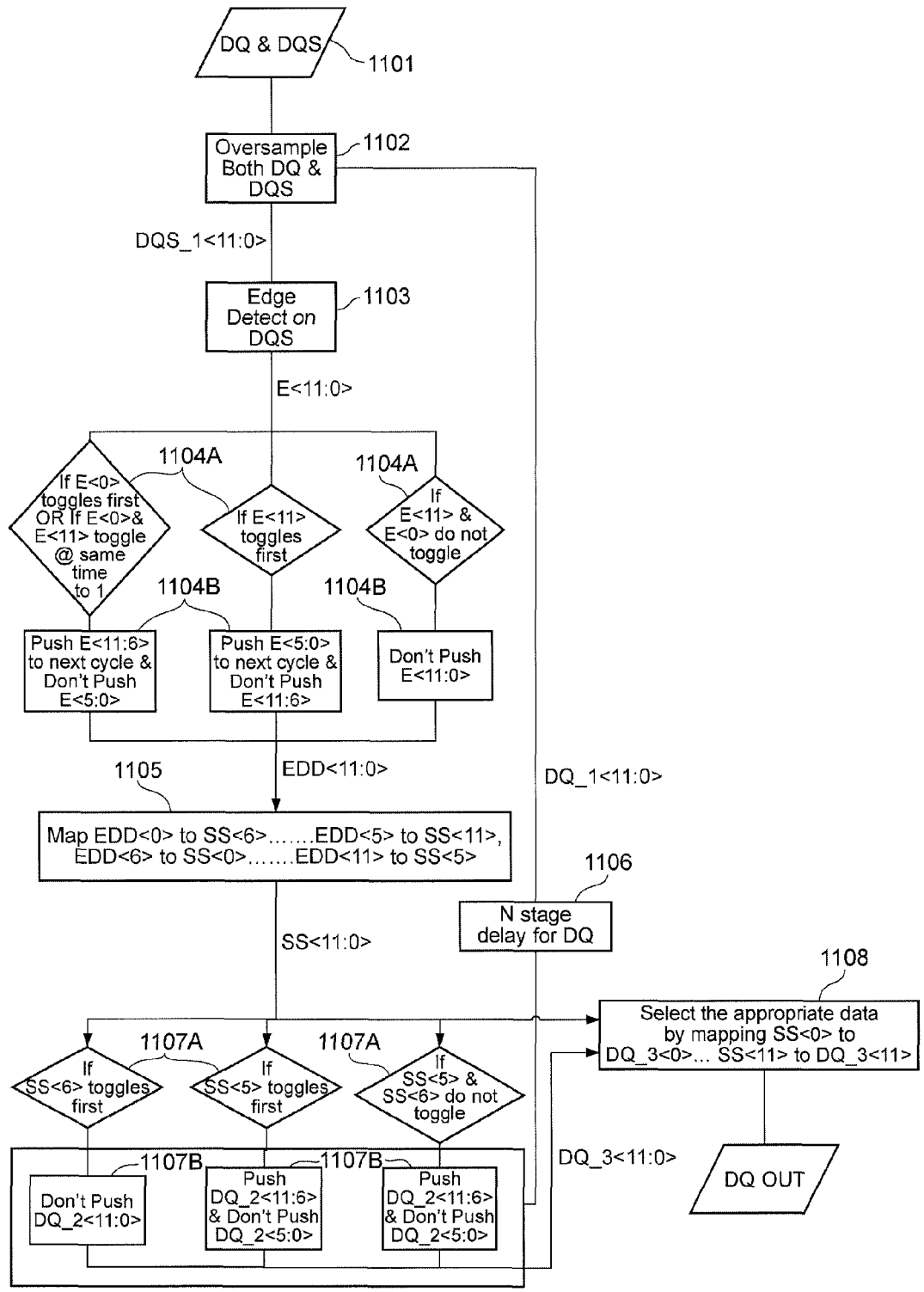
FIG. 11B is a flow diagram of a method for data acquisition in a memory system, according to one or more embodiments of the present disclosure.

According to one or more embodiments of the present disclosure, the edge detector has been implemented in a continuous time domain, which is in a circular form, and, thus, the outputs EDGE<n−1:0> will be continuous in time with a shift of T/n delay for n clock phases of the multiphase clock, where T is the time period of the DQS signal. Consequently, when each signal of series of edge detected signals EDGE<n−1:0> is retimed to CLK<0>, in most of the cases E<n−1> and E<0> may never overlap. However, because of jitters, if the duty cycle of the incoming DQS signal decreases and if the rising edge of the DQS signal occurs between CLK<n−1> and CLK<0> or if the falling edge of the DQS signal occurs between CLK<n−2> and CLK<n−1>, both E<0> and E<n−1> of second strobe series may start to toggle at the same time. The timing diagram for EDGE<0>, EDGE <n−1>, E<0>, and E<n−1> signals in such a scenario is shown in, for example, FIGS. 4a and 4b, respectively. In order to avoid any overlapping edges, edge adjustment, at step 1104, according to one or more embodiments of the present disclosure, may be made on the basis of toggling states of E<0> and E<n−1> signals. In order to avoid the above toggling scenario, edge adjustment of the second strobe series E<n−1:0> may need to be performed by the edge adjuster block 130, as depicted in, e.g., FIG. 5a. According to one or more embodiments of the present disclosure, the edge adjuster block 130 may perform edge adjustment of second strobe series by shifting E<n/2−1:0> or E<n−1:n/2> (if required) to the next sampling window on the basis of a toggling state of E<0> and E<n−1> signals. Particularly, edge adjuster block 130 may check whether a first signal, E<0>, and a last signal, E<n−1>, of the second strobe series toggle simultaneously or independently. Based on this determination, the edge adjuster block 130 may shift the sampling window of either a former half or a latter half of the signals of the second strobe series to a next sampling window. To explain the working of the edge adjuster block 130, reference is made to, for example, FIG. 11B. FIG. 11B elaborates the method of FIG. 11A according to one or more embodiments of the present disclosure. While steps 1101 to 1103 are same as that in FIG. 11A, steps 1104A and 1104B of FIG. 11B elaborate step 1104 of FIG. 11A. The working is explained herein by taking the value of n to be 12. Referring to FIG. 11B for purposes of illustration only, the edge adjuster block 130 may check the following situations for performing an adjustment:

If E<0> (the first signal) and E<11> (the last signal) toggle from low to high in a first read cycle (step 1104A), then the latter half of signals of second strobe series, e.g. E<11:6> is pushed to the next sampling window.

If E<0> toggles first from low to high in the first read cycle (step 1104A), then the latter half of signals, e.g. E<11:6> is pushed to the next sampling window (step 1104B). This is done to avoid overlap(s) of signals that may be caused due to jitters on DQS triggering any signal of E<11:6>.

If E<11> toggles first from low to high in the first read cycle (step 1104A), then the former half of signals of second strobe series, e.g. E<5:0> is pushed to the next sampling window (1104B).

If E<0> and E<11> do not toggle, then none of the edge data is pushed to the next sampling window.

Figure 5A:
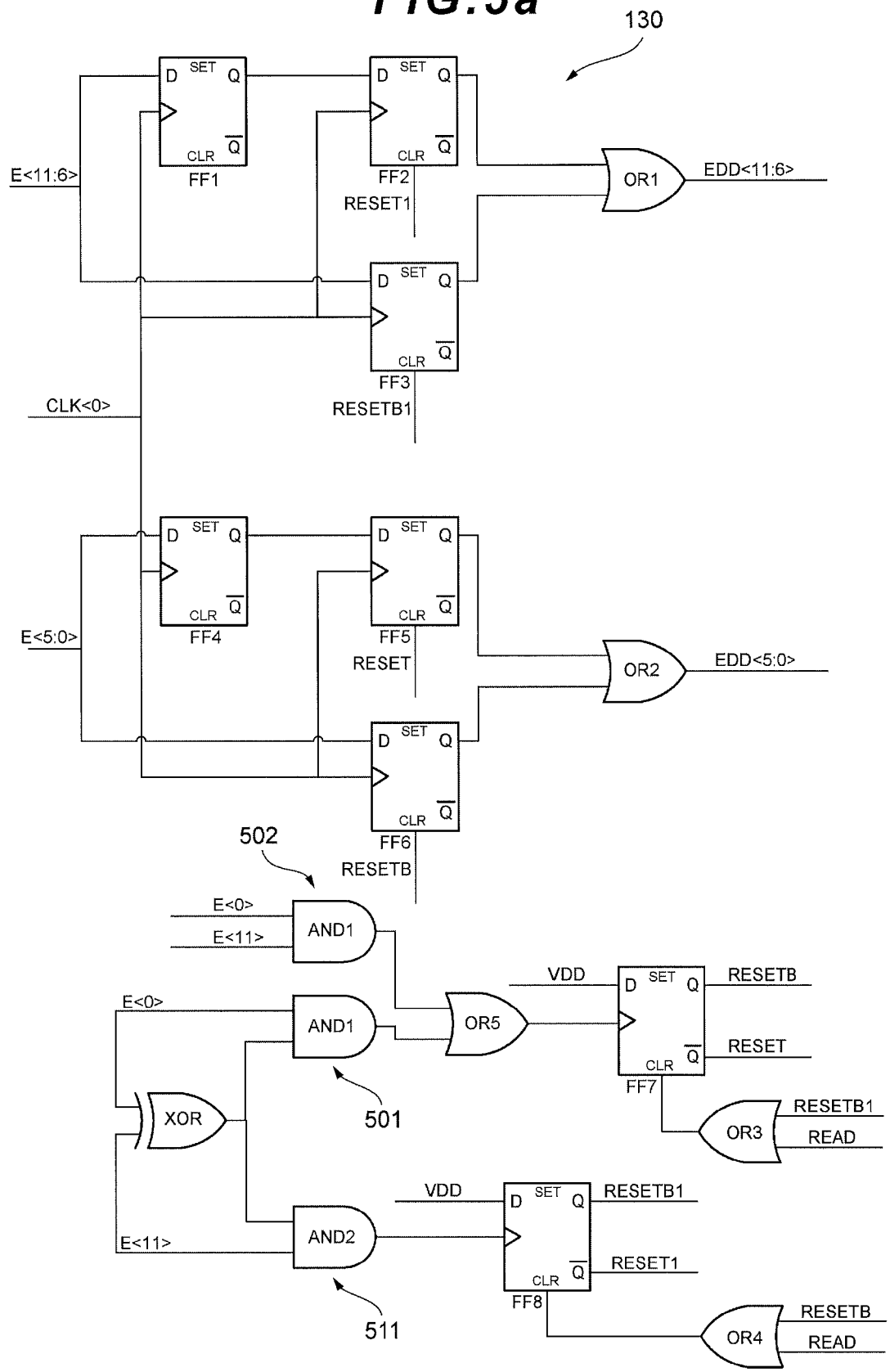
FIG. 5a is a circuit diagram of an edge adjuster block of a DDR PHY according to one or more embodiments of the present disclosure.

FIG. 5a, for example, illustrates a circuit diagram of the edge adjuster block 130. As shown, the edge adjuster block 130 may include a plurality of gates and flip-flops (FF) in combination, each of which may perform a specific function. When the read operation begins, e.g., when the READ signal goes high, all the flip-flops may be reset. According to one or more embodiments of the present disclosure, the combination of AND1-XOR 501 and combination of AND2-XOR 511 may check for the rising edge on E<0> and E<11> respectively. Also, in order to check the simultaneous rising of E<0> and E<11>, an AND gate 502 is employed. Either FF7 or FF8 may register a first rising edge that resets the other flip-flop in order to avoid further edge checking. Based on the outputs of FF7 and FF8, FF1 to FF6 may be enabled/disabled to generate the correct non-overlapping series of edge signals EDD<n−1:0> referred to as a third strobe series and shown as EDD<11:0> in FIG. 5b. EDD<0> and EDD<11> represent the signal upon outputs from edge adjustment block 130 for the signals E<0> and E<11> respectively. The edge adjuster block 130 may receive the second strobe series as input and generates the third strobe series as output. Particularly, the third strobe series may be a series of edge signals in which all the signals, e.g., EDD<0> to EDD<11> are non-overlapping. Further, the second strobe series and/or the third strobe series may be delayed by a T based delay block 140 in order to maintain timing restriction and be in synchronism with data signals.

Referring back to FIG. 11A, at step 1105, in order to capture correct DQ signal information, sample selection of the third strobe series EDD<n−1:0> may be performed. The sample selection may be required because for a signal sampled using multiphase clock of n phases, the correct data would be the middle sample, e.g., at sample location n/2. Particularly, the correct sample is obtained by linear shifting of each signal of the third strobe series by a value n/2. For example, for n=12, the edge signal EDD<0> will have the correct information at the sample [EDD+n/2]=[0+12/2]=$6^{th}$ sample e.g., SS<6>. Likewise, for EDD<1>, the correct information is at sample SS<7> and so on. However, when the value [EDD+n/2]>n−1, the correct sample information, according to one or more embodiments of the present disclosure, may be at sample [EDD−n/2], of the next cycle. Sample mapping information for n=12 (as an example) has been shown in Table 1 (below).

TABLE 1

| EDGE Info(EDD<11:0>) | Sample Selector(SS<11:0>) |
| --- | --- |
| EDD<0> | SS<6> |
| EDD<1> | SS<7> |
| EDD<2> | SS<8> |
| EDD<3> | SS<9> |
| EDD<4> | SS<10> |
| EDD<5> | SS<11> |
| EDD<6> | SS<0> - next cycle- |
| EDD<7> | SS<1> - next cycle- |
| EDD<8> | SS<2> - next cycle- |
| EDD<9> | SS<3> - next cycle- |
| EDD<10> | SS<4> - next cycle- |
| EDD<11> | SS<5> - next cycle- |

Further, the generic formula for calculating the correct sample location 'M' for a given edge location (EDD) is mentioned below.

If(EDD+(n)/2)<n then M=EDD+(n)/2

Else if(EDD+(n)/2)>n−1 then M=EDD−n/2[next cycle data]     (1)

It should be noted that the third strobe series EDD<n−1:0> is processed as per the mapping scheme of Table 1 and Equation (1) so as to obtain a sample selected series SS<n−1:0>.

Figure 7:
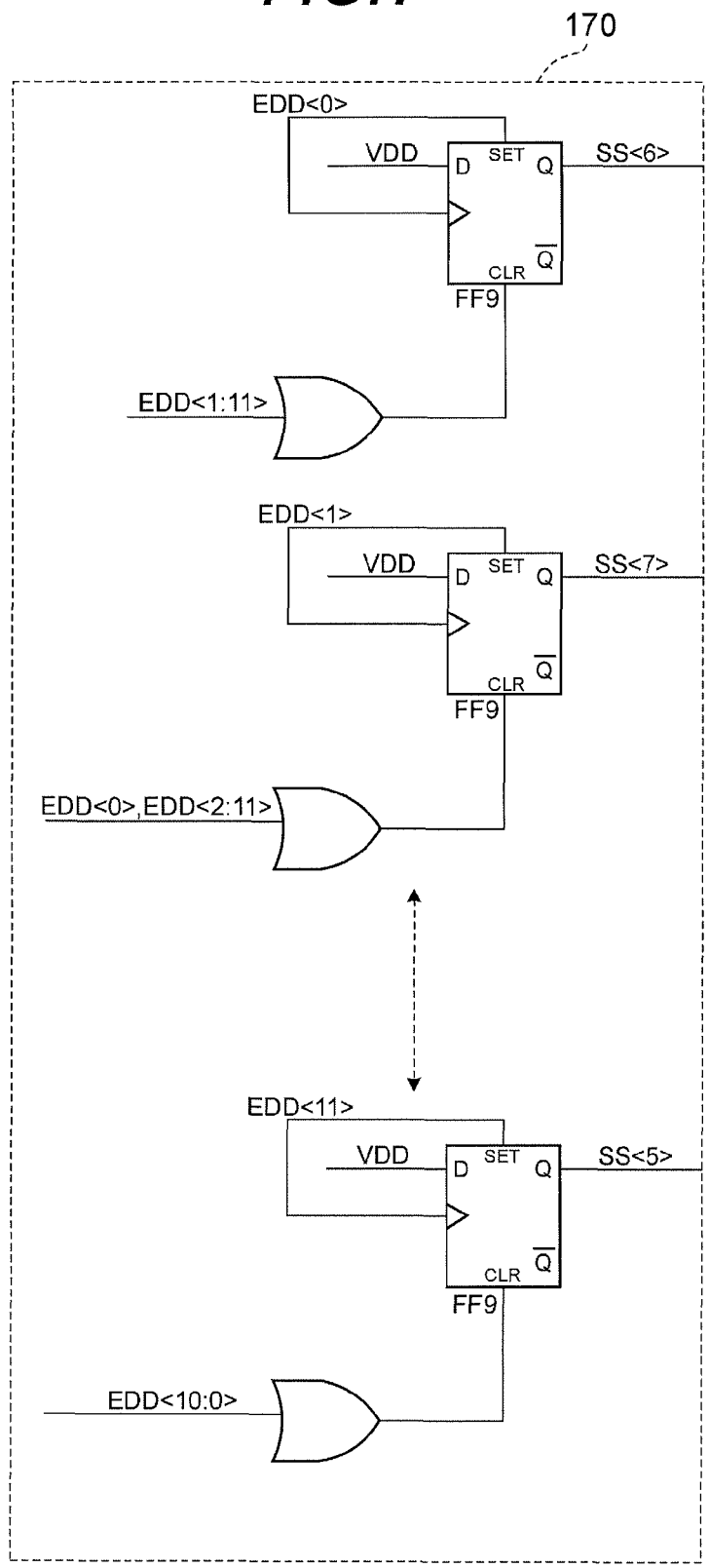
FIG. 7 is a circuit diagram of a sample selector block of a DDR PHY according to one or more embodiments of the present disclosure.

The methodology described above is implemented in a sample selector block 170 (FIG. 1) that has been explained in detail in, e.g., FIG. 7. The implementation of the sample selector block 170 according to one or more embodiments of the present disclosure may be carried out using the "Ccnt" algorithm; however, other equivalent algorithms like "S2par" may also be used for implementing sample selection. Particularly, the Ccnt algorithm may require that the third strobe series EDD <n−1:0> has non-overlapping edges among the signals from EDD<0> to EDD <n−1>, which has been taken care of by the edge adjuster 130, as already described. The sample selector block 170 may translate the third strobe series EDD<n−1:0> to the sample selection signal SS<11:0> in accordance with relation shown in, e.g., Table 1 and Equation (1). Functioning of the sample selector block 170 is explained as follows. Each of the D flip-flop of the sample selector block 170 may be supplied with a data input as 1 (VDD) and a clock input corresponding to the EDD signal. Further, each of the D flip-flop is supplied the SET input as corresponding to the EDD signal and RESET input as OR for all the remaining EDD signals, as shown in, e.g., FIG. 7. Therefore, whenever any of the signals of the third strobe series EDD<n−1:0> becomes 1 (High), say EDD<0>=1, then the corresponding D flip-flop may be SET and the corresponding output may become 1 (High), e.g., SS<6>=1. The remaining SS signals (e.g., SS<11:7> and SS<5:0>) may become 0 (Low) as the RESET signal of all remaining flip-flops may be High. Likewise, if EDD<1>=1, then SS<7>=1 and remaining SS signals may be 0.

For the correct data to be captured, it is essential that the DQ signal is delayed to be in synchronization with the sample selected data SS. According to one or more embodiments of the present disclosure, this is done using a T-based delay and the sample adjustment as shown in, e.g., FIG. 6 and FIG. 8. FIG. 6 is a T-based delay block 160 for the first data series DQ_1<n−1:0> signal. As explained, delay on the signal DQ_1<n−1:0> may be required in order to compensate for the time elapsed in determining the sample selected series SS<n−1:0>. As shown in, e.g., FIG. 6, the first data series DQ_1<n−1:0> may be first retimed to CLK<0> by a retiming block 650. The retiming block 650 may be similar in function to that of the retiming block 350, as shown in, e.g., FIG. 3, and, therefore, detailed explanation thereof is omitted. Upon retiming to CLK<0>, the retimed DQ signal may be delayed by an N stage delay 660 that outputs a second data series representing DQ_2<n−1:0>. This is shown, for example, at step 1106 in FIGS. 11A and 11B. Because the plurality of stages of the flip-flops for the retiming block 650 and T-based delay may be predetermined, based on desired delay, they may be directly implemented in the hardware. Similar to the retiming block 350, the retiming block 650 may perform shifting of each of the signals of the first data series to the same clock phase. According to one or more embodiments of the present disclosure, the retiming block 650 may receive the first data series as an input and generate the second data series as an output.

As mentioned above, the second data series DQ_2<n−1:0> may need to be processed by sample adjustment before correct data signal can be captured. Therefore, in order to retrieve the correct data from the second data series DQ_2<n−1:0>, it may be adjusted so as to be in synchronization with the sampling window of the sample selected signal SS<n−1:0>. Similar to the edge adjustment on the DQS signal in step 1104 (FIG. 11A), the DQ signal is adjusted at, for example, step 1107 (FIG. 11A) on the basis of toggling states of SS<n/2> and SS<n/2−1>. Steps 1107A and 1107B in FIG. 11B further elaborate step 1107. Particularly, depending on whether SS<6> toggles first or SS<5> toggles first or whether SS<6> & SS<5> toggle simultaneously, the sampling window may be selected.

Figure 8:
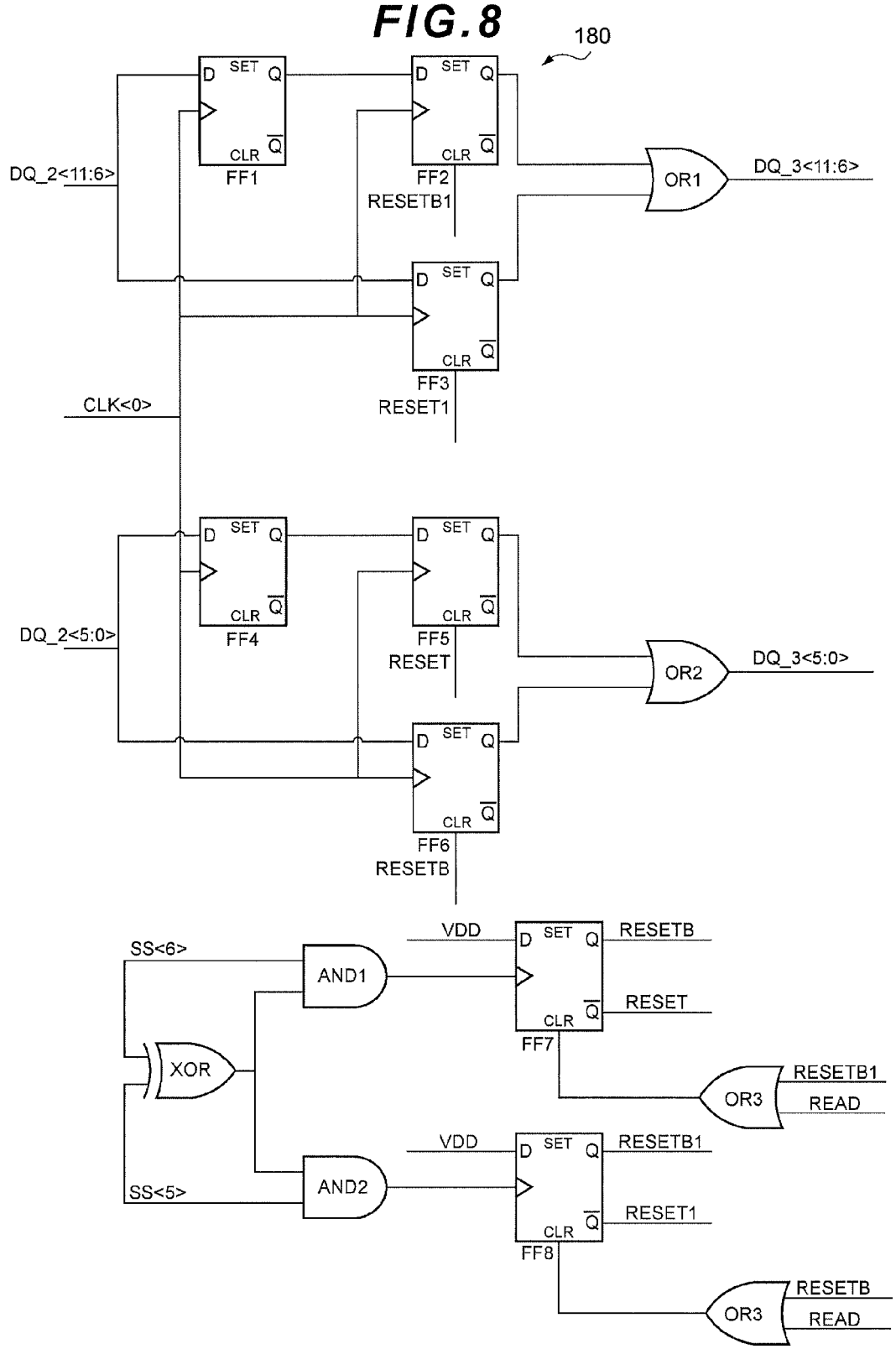
FIG. 8 is a circuit diagram of a sample adjuster block of a DDR PHY according to one or more embodiments of the present disclosure.

FIG. 8 is a circuit diagram of a sample adjuster 180 for sample adjustment of second data series DQ_2<n−1:0> according to one or more embodiments of the present disclosure. The configuration of the sample adjuster 180 may be similar to that of the edge adjuster 130 with a few exceptions to be discussed. Based on the output of a sample selector, the adjustment of the sampling window for the second data series may be carried out as per relation given in Table 2. Table 2 is prepared by considering n=12 for purposes of illustration only. The implementation of the sample adjuster 180 can be made directly in the hardware as per the mapping scheme of Table 2.

TABLE 2

| Edge Info (EDD<11:0>) | Sample Selector (SS<11:0>) | If SS<6> & SS<5> toggles Sampling Window | If SS<6> toggles first Sampling Window | If SS<5> toggles first Sampling Window |
|---|---|---|---|---|
| EDD<0> | SS<6> | Present | Present | Next |
| EDD<1> | SS<7> | Present | Present | Next |
| EDD<2> | SS<8> | Present | Present | Next |
| EDD<3> | SS<9> | Present | Present | Next |
| EDD<4> | SS<10> | Present | Present | Next |
| EDD<5> | SS<11> | Present | Present | Next |
| EDD<6> | SS<0> | next | Present | Present |
| EDD<7> | SS<1> | next | Present | Present |
| EDD<8> | SS<2> | next | Present | Present |
| EDD<9> | SS<3> | next | Present | Present |
| EDD<10> | SS<4> | next | Present | Present |
| EDD<11> | SS<5> | next | Present | Present |

The sample adjustment of second data series DQ_2<n−1:0> may be required to avoid simultaneous toggling of signals EDD<0> and EDD<n−1>. The sample adjustment of the second data series may include determining the toggling states of SS<n/2−1> and SS<n/2> signal of the sample selected series and checking whether they toggle simultaneously or independently. Based on this determination, sampling window of either a former or a latter half of the signals of the second data series DQ_2<n−1:0> may shifted to the next sampling window. As shown in, e.g., Table 2, sample selected signals SS<6>[e.g., n/2th] and SS<5>[e.g. n/2−1 th] signals may correspond to the edge information signals EDD<0> and EDD<11> respectively, and, therefore, the sample adjustment may be performed on the basis of toggling of SS<6> and SS<5>. Similar to the operation of the edge adjuster 130, the sample adjusters 180 of all the flip-flops may be reset to low at the start of READ cycle.

Thereupon, on the basis of the toggling state of SS<6> and SS<5> signals, the sampling window adjustment for the second data series DQ_2<11:0> may be performed in accordance with the mapping in Table 2. Particularly, the sample adjuster block 180 may check the followings situations for performing the adjustment:

If SS<6> and SS<5> toggle from low to high (step 1107A), then the latter half of the signals of second data series, e.g., DQ_2<11:6> may be pushed to the next sampling window (1107B).

If SS<6> toggles first from low to high (step 1107A), then none of the signals of second data series may be pushed to the next sampling window.

If SS<5> toggles first from low to high (step 1107A), then former half of signals of second data series, e.g. DQ_2<5:0> may be pushed to the next sampling window (1107B)).

If SS<5> and SS<6> do not toggle, then none of the signals of second data series may be pushed to the next sampling window.

It should be noted that, because the edge adjuster 130 ensures that EDD<0> and EDD<11> do not toggle simultaneously, the textbook case of simultaneous toggling of SS<6> and SS<5> should never occur as SS<6> and SS<5> are corresponding signals for EDD<0> and EDD<11>, respectively. Accordingly, the logic for checking simultaneous toggling of SS<6> and SS<5> has not been implemented in sample adjuster 180 while this logic is implemented in the edge adjuster 130 using the AND gate 502. However, the same has been depicted in, e.g., Table 2 and implementing hardware for such a scenario may be arranged in the hardware for the sample adjuster block 180. Also, in case where SS<6> toggles first, which, in turn, implies that E<0> toggles, the correct data may be in the present sampling window as the adjustment of sampling window in case of E<0> toggling has already been taken care of by the edge adjuster 130 and this logic is different from the one implemented in the edge adjuster 130 for the case, where E<0> toggles first. Upon sample adjustment by the sample adjuster 180, third data series having a series of adjusted data signals, represented as DQ_3<11:0> in, e.g., FIG. 1, may be generated and sent for data selection. Particularly, the sample adjuster 180 may receive the second data series as an input and generate the third data series as an output.

Figure 9:
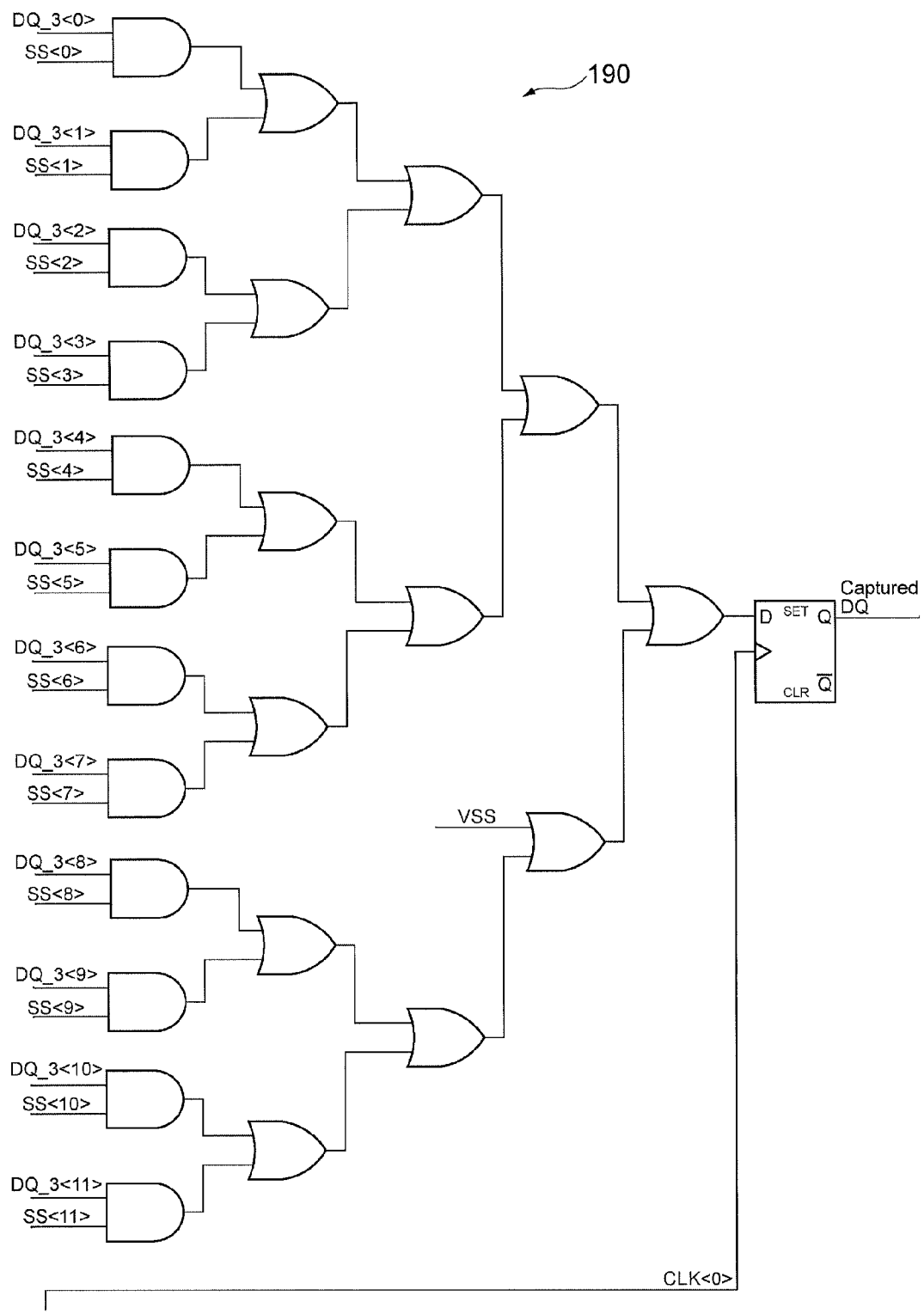
FIG. 9 is a circuit diagram of a data selector block of a DDR PHY according to one or more embodiments of the present disclosure.

At step 1108, a final data signal may be selected by multiplexing third data series DQ_3<n–1:0> with sample selected series SS<n–1:0>. Data selection may be performed by a data multiplexer (MUX) implementation as shown in, e.g., FIG. 9. A correct data signal may be captured by multiplexing the oversampled DQ_3<11:0> with the sampled data S<11:0>. Each signal of third data series DQ_3<n–1:0> may be performed by the AND operation with a corresponding sample selected bit 'S' and combined together to generate the captured DQ signal.

Figure 10:
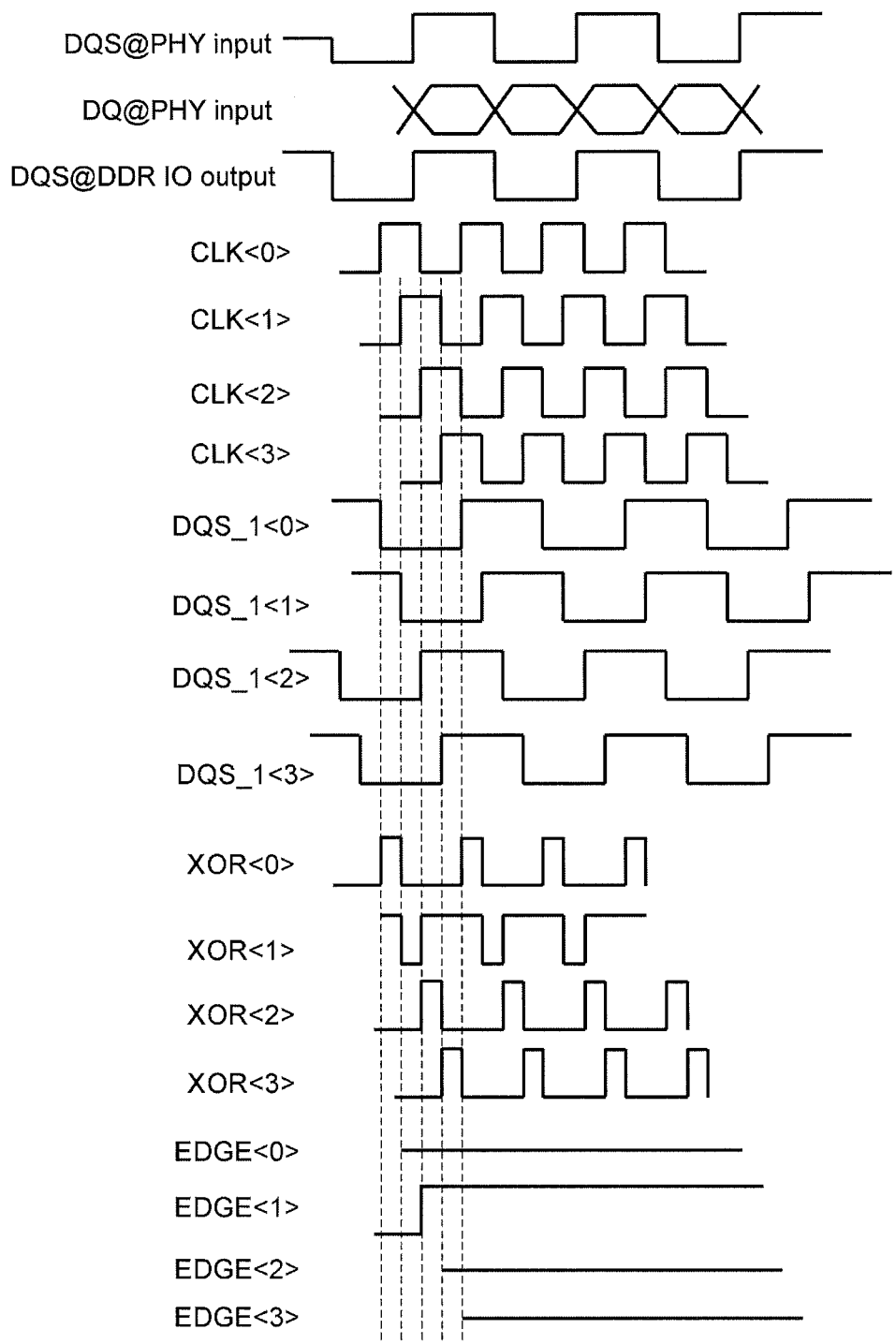
FIG. 10 is a timing diagram of various signals within a DDR PHY according to one or more embodiments of the present disclosure.

FIG. 10 is a timing diagram for various signals at various stages until the edge detector 120 according to one or more embodiments of the present disclosure. The timing diagram has been shown using n=4 for purposes of illustration only. As mentioned previously, in order to correctly determine the DQ signal, its relationship with clock should be determined. Also, because the DQ signals and the DQS signal have a fixed relationship in a DDR system, it may be sufficient to determine a relationship between the DQS signal and the clock in order to capture a correct DQ signal. As shown in, e.g., FIG. 10, multiphase clock signals, CLK<3:0> may oversample the DQS signal to obtain DQS<3:0>. The oversampled signal DQS<3:0> may then pass through the edge detector 120. The output, XOR<3:0>, of the XOR gates 310 of the edge detector and the EDGE<3:0> of the D flip-flops 320 has been shown in the timing diagram. The output following the XOR operation with two adjacent DQS oversampled signals may represent the edge data. Edge information signal E<n–1:0> may then be determined using the D flip-flops and the corresponding clocks.

Figure 12:
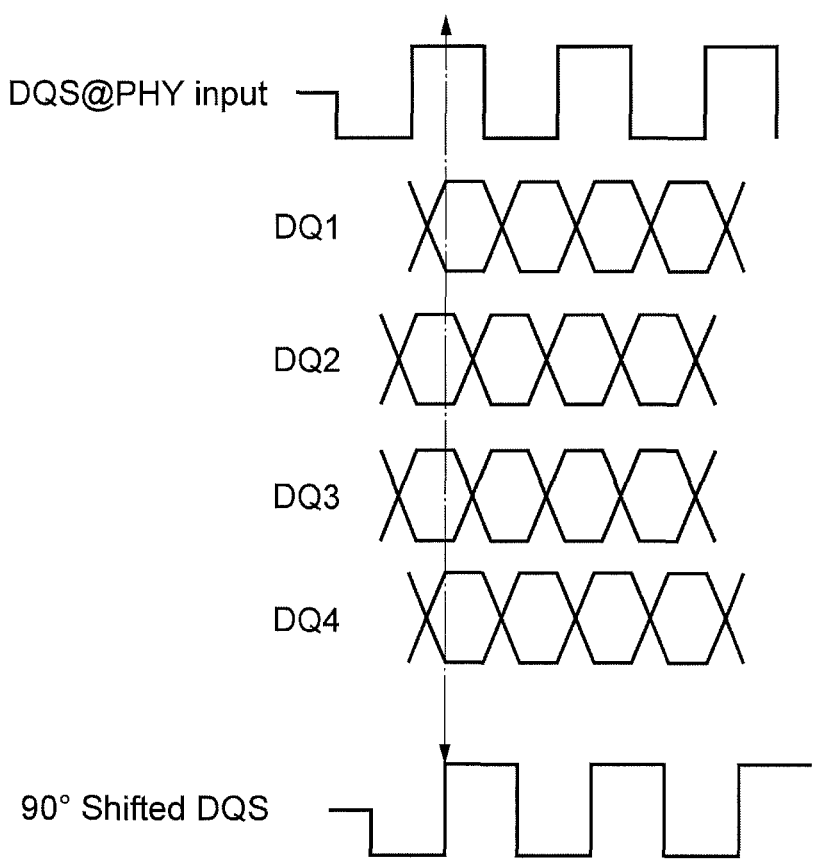
FIG. 12 is a timing diagram of various DQ bit signals having offset according to one or more embodiments of the present disclosure.

According to one or more embodiments of the present disclosure, a single DQS has been utilized for capturing 'k' number (bits) of DQ signals. This implementation may be possible only if there is no mismatch between individual DQs. The mismatch may be due to routing or other mismatches at the PCB level, which may cause some static delays between individual DQ bit signals. In case there is mismatch between individual DQ bit signals, capturing of correct data using the DQS signal may not be possible and the data (DQ) may be lost due to offset. FIG. 12, e.g., shows four mismatched DQ bit signals. Therefore, there may be a need to adjust the offset individual DQ signals in order to capture correct data.

Figure 13:
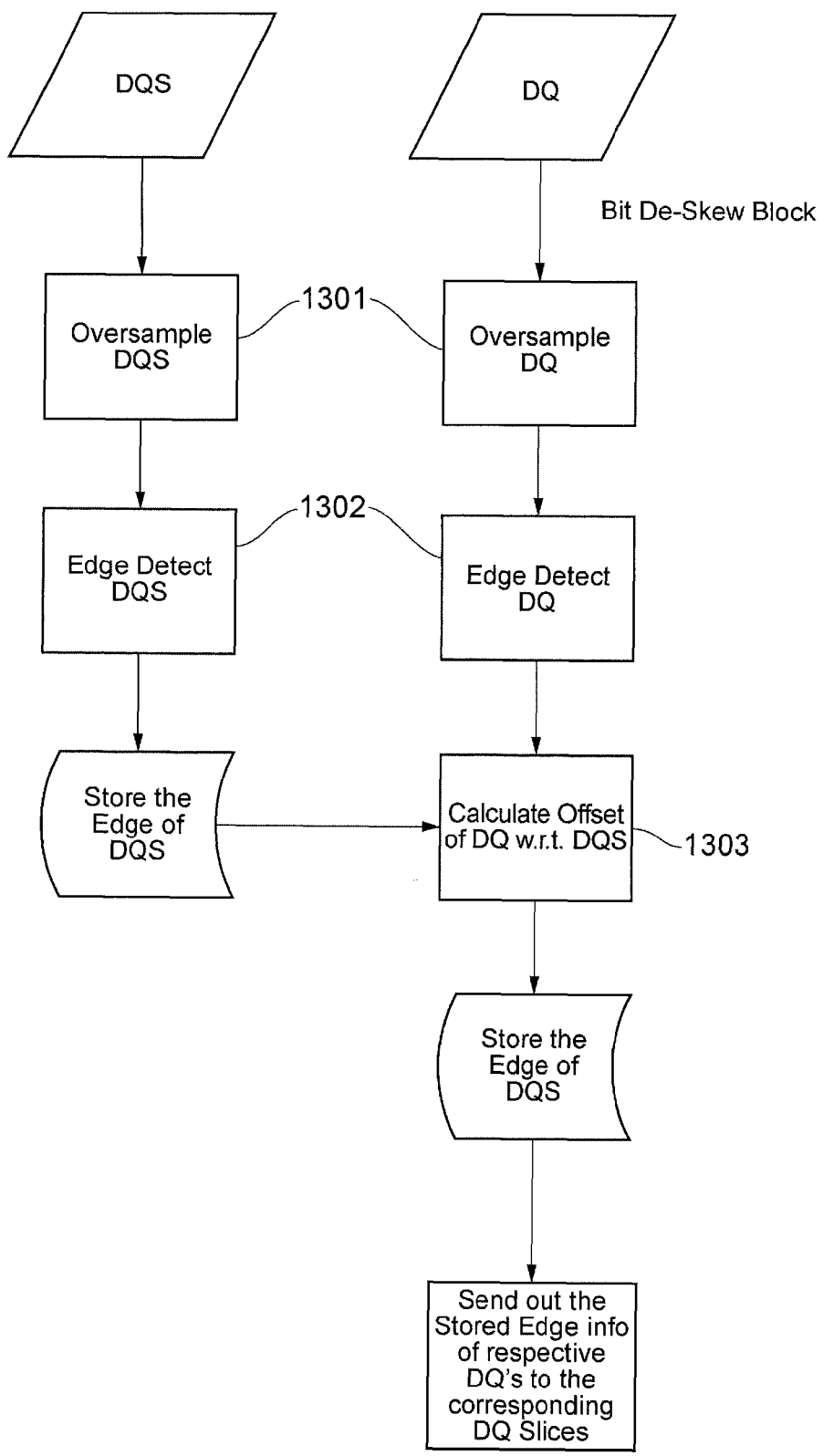
FIG. 13 is a flow diagram of a method for data acquisition according to one or more embodiments of the present disclosure.

According to one or more embodiments of the present disclosure, in order to avoid the problem of offset amongst individual DQ bit signals, a Bit De-skew method may be implemented. For the implementation of the Bit De-skew method, the offset values may be calculated only once in the training phase and thereafter the calculated offset values may be recalled, when required, for negating the offset. FIG. 13, e.g., illustrates a flow diagram for a method for determination of offset using Bit De-skew. As shown, at 1301 DQ signals and DQS signals may be received. Both DQS and DQ signals may be oversampled and edge detected at blocks 1301 and 1302, respectively. At block 1303, difference (e.g., offset value) between the DQS and the individual DQ bit signals may be calculated and stored for future use. Once the offset for each of the individual DQ signals is calculated, the training phase may be completed and the offset values may be set and stored. The stored offset value for each DQ bit may then added or subtracted from the value of M calculated as per Equation 1. This offset thus may compensate for static delay mismatch between individual DQ bit signals. FIG. 13, e.g., shows the calculation of offset for each DQ signal in a serial order; however, the same may be implemented to calculate the offset for 'k' number of DQ bits simultaneously.

Figure 14:
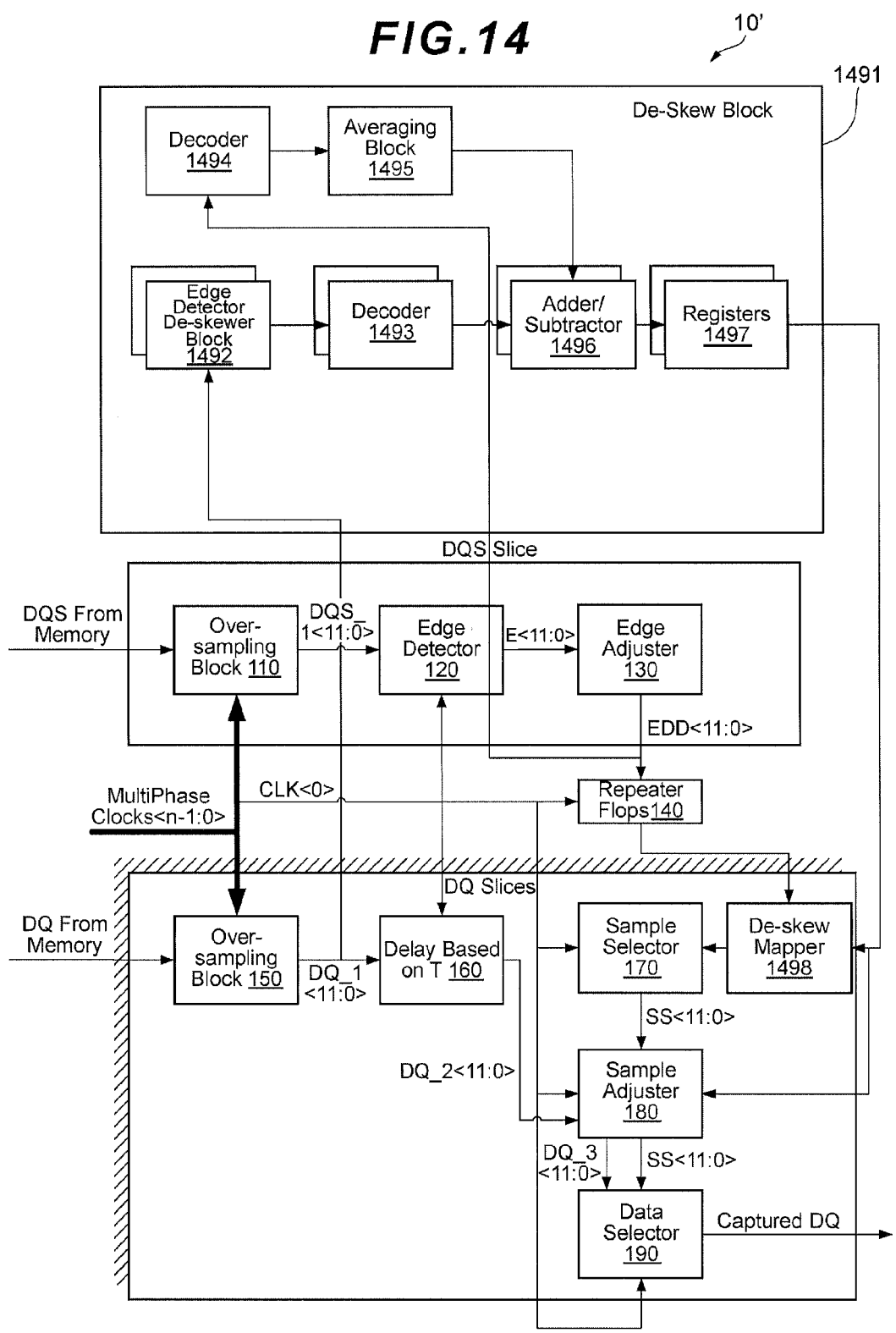
FIG. 14 is a functional block diagram of a DDR PHY of a memory system according to one or more embodiments of the present disclosure.
Figure 15:
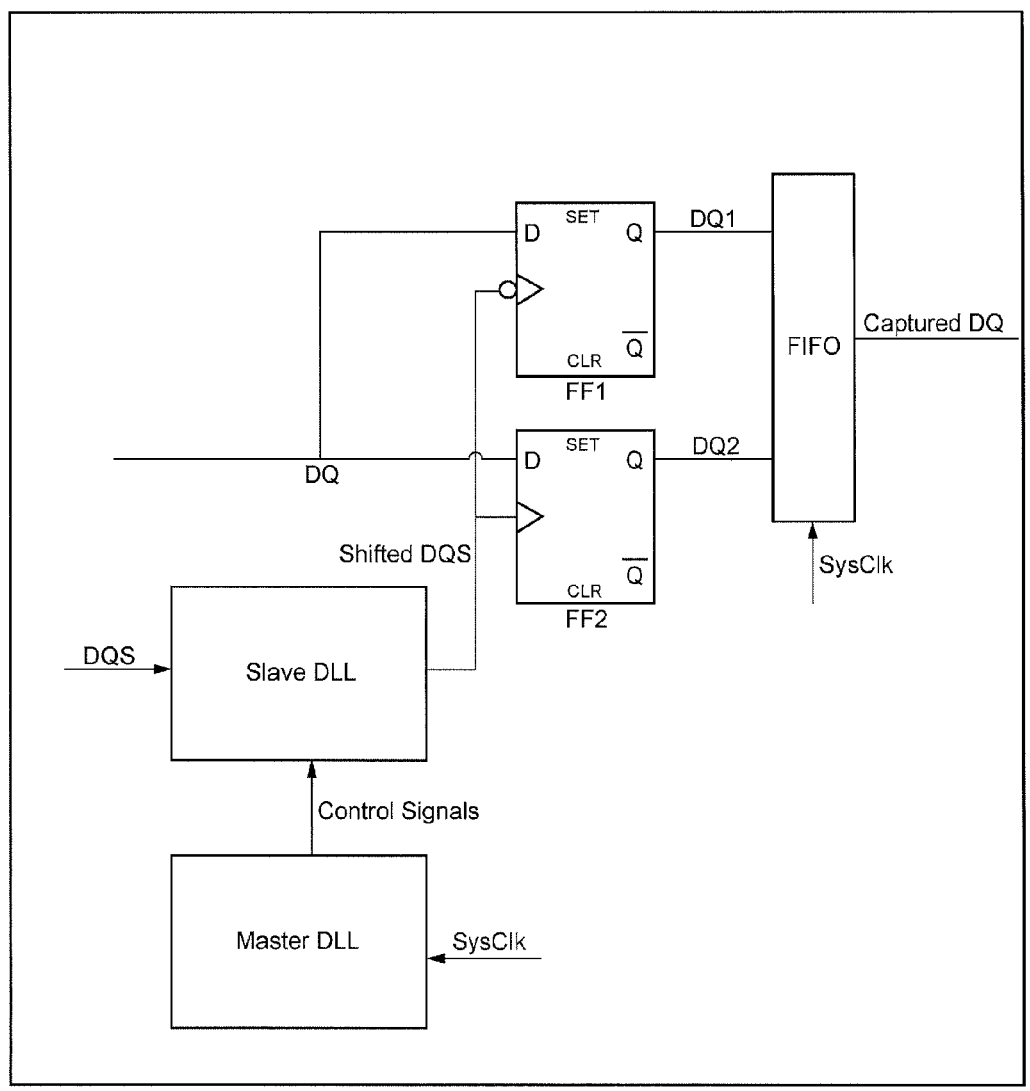
FIG. 15 is a circuit diagram of a conventional technique of data capturing using a Master Slave DLL.

FIG. 14 illustrates a functional block diagram of a DDR PHY 10' of a memory system according to one or more embodiments of the present disclosure. The DDR PHY 10' may be similar to DDR PHY 10 of FIG. 1 with the exception of an additional De-skew block and a mapper. The blocks that are similar are referred to with the same reference numerals. As shown, a De-skew block 1491 may receive an oversampled DQ signal and an edge adjusted DQS signal from the oversampling block 150 and the edge adjuster 130, respectively. The Bit De-skew block 1491 may use the first data series DQ_1<n–1:0> and the third strobe series EDD<n–1:0> already generated by the blocks. Alternatively, the Bit De-skew block 1491 may be modified to receive the original DQS and DQ signals which may be oversampled and edge detected (or adjusted) in Bit De-skew block 1491 itself.

Further, the DQ_1<n–1:0> signal may be edge-detected by the edge detector De-skewer block 1492 and may be decoded by a decoder 1493 that converts a 12 bit data into a 4 bit data. The decoder 1493 may include additional functionality of edge adjustment, if required. Likewise, edge adjusted DQS signals DQS <n–1:0> may be decoded by a decoder 1494. This decoded DQS signal may be further passed through an averaging block 1495 that calculates only static delay values and thus avoid any dynamic variations. It has been observed that the DQS signal exhibits dynamic toggling and, thus, to avoid any dynamic variations in DQS signal, the averaging block 1495 may be configured to calculate only the average value, thereby avoiding dynamic variations in DQS signal. Further, because DQ has only two toggling states, no averaging may be required for the DQ signal; however, if there are dynamic variations in the DQ signal, averaging of the same may be performed as well. Furthermore, the offset value (Q) in the values of DQ with respect to DQS may be calculated and stored by an adder/subtractor 1496 and a register 1497, respectively. Stored offset value from the register 1497 may then be sent to the De-skew mapper 1498. The De-skew mapper 1498 may encode the 4 bit signal to 12 bit signal and may also add/subtract the offset value (Q) from the value of M, as calculated from Equation 1. The relation as given in Equation 1 may be accordingly modified to include the offset as follows:

If(EDD+$(n)/2$)<$n$ then $M$=EDD+$(n)/2 \pm Q$

Else if(EDD+$(n)/2$)>$n$–1 then $M$=EDD–$n/2 \pm Q$[next cycle data]      (2)

As per the value of 'M' calculated using Equation 2, the appropriate data may be selected by sample adjustment and data selection by sample adjuster 180 and data selector 190 respectively, as already explained.

The disclosure achieves various advantages over the prior art. Because a Master-Slave DLL is not required in the embodiments of the present disclosure, jitter and on-chip variations due to a Slave DLL and delay lines are reduced. One or more embodiments of the present disclosure improve the timing margins of the signals. Further, because, in the DDR interface, one DQS will be present for 8 DQ lanes, embodiments of the present disclosure do not require a CDR (clock-data recovery circuit) on each Data lane. Due to edge detection and sample selection on DQS, less area and power are required by the circuit when compared to that of the conventional method(s). Accordingly, the area penalty is very high because, in a 32 bit DDR system, the conventional method(s) would need to keep 32 CDR's in the DDR-PHY, which has very high power and area consumption. Furthermore, there is no need of FIFO to be placed in the DDR PHY as per the disclosure, because of which there is a huge advantage on area.

The disclosure should not be regarded as being limited to the embodiments described above. Rather, various modifications and combinations may be carried out without departing from the spirit of the disclosure. For example, modifications may be done in edge detection and edge adjuster block to accommodate a half-rate frequency. Likewise, modifications can be done in edge adjuster and sample adjuster to accommodate more jitter & pulse distortion by including extra logic on signals E<11:0> and SS<11:0>. Also, sample adjuster, reset to flops and number of flops may be changed based on the number of stages in T-Based delay. Furthermore, those of ordinary skill in the art would appreciate that certain "blocks" of one or more embodiments of the present invention may be implemented by a circuit, processor, etc. using known methods. Accordingly, the scope should be limited only by the attached claims.

What is claimed is:

1. A method for data acquisition in a memory system, comprising:
   receiving a data signal and a strobe signal;
   oversampling the data signal and the strobe signal with a multiphase clock having n phases to generate a series of data signals and a series of strobe signals representing a first data series and a first strobe series, respectively;
   generating a second strobe series by edge detection of the first strobe series followed by retiming of the edge detected series;
   generating a third strobe series by edge adjustment of the second strobe series, wherein the edge adjustment ensures that there are no overlapping edges among the signals of the third strobe series;
   generating a sample selected series by linear shifting each signal of the third strobe series by n/2;
   generating a second data series by retiming the first data series;
   generating a third data series by sample adjustment of the second data series, wherein the sample adjustment ensures that the third data series is in synchronization with a sampling window of the sample selected series; and
   determining a final data signal by multiplexing the third data series with the sample selected series.

2. The method of claim 1, wherein the edge detection is performed by XOR operation on consecutive signals of the first strobe series.

3. The method of claim 1, wherein the retiming is performed to retime all the signals of a series to a particular phase of the multiphase clock.

4. The method of claim 1, wherein the edge adjustment is performed based on a determination of toggling states of a first signal and a last signal of the second strobe series.

5. The method of claim 4, wherein the determination of toggling state comprises checking whether the first signal and the last signal toggle simultaneously or independently, and, according to the determination, shifting the sampling window of either a former or a latter half of the signals of the second strobe series to a next sampling window.

6. The method of claim 1, wherein the second data series is delayed to compensate for time elapsed in generation of the sample selected series.

7. The method of claim 1, wherein the sample adjustment of the second data series for generating the third data series comprises determining toggling states of the (n/2−1)th and the (n/2)th signal of the sample selected series, checking whether the (n/2−1)th and the (n/2)th signal of the sample selected series toggle simultaneously or independently, and, accordingly, shifting the sampling window of either a former or a latter half of the signals of the second data series to the next sampling window.

8. The method of claim 1, wherein the linear shifting is performed as per relation below:

If(EDD+(*n*)/2)<*n* then *M*=EDD+(*n*)/2

Else if(EDD+(*n*)/2)>*n*−1 then *M*=EDD−*n*/2[next cycle data]

where 'M' represents the sample location upon shifting.

9. The method of claim 1, further comprising offsetting the signals of the third strobe series to compensate for a mismatch among individual bits of the data signal.

10. The method of claim 9, wherein the offset is calculated by oversampling the data signal and strobe signal, performing edge detection of the oversampled data signal and strobe signal, and determining difference between the edge detected data signal and the edge detected strobe signal.

11. The method of claim 9, wherein the offset is calculated and stored during training.

12. The method of claim 1, further comprising delaying any of the first strobe series, second strobe series, and third strobe series.

13. A device for data acquisition in a memory system comprising:
   a DDR IO block configured to receive a strobe signal and a data signal from memory;
   an oversampling circuit configured to oversample the strobe signal and the data signal with a multiphase clock having N phases to generate a first strobe series and first data series respectively;
   an edge detector circuit configured to detect the edge information of the first strobe series and perform retiming thereof to generate a second strobe series;
   an edge adjuster circuit configured to adjust edge of the second strobe series to generate a third strobe series;
   a sample selector circuit configured to map the third strobe series to generate a sample selected series;
   a retiming circuit configured to perform retiming of the first data series to generate a second data series;
   a sample adjuster circuit configured to adjust the sampling window of the second data series to generate a third data series;
   a data selector circuit configured to multiplex the sample selected series and the third data signal to generate a final data signal, wherein the edge adjuster circuit and the sample adjuster circuit performs the adjustment to ensure that there are no overlapping edges in the third strobe series and the third data series respectively, and wherein the sample selector circuit generates the sample selected series by linear shifting of each signal of the third strobe series by N/2.

14. The device of claim 13, wherein the retiming circuit comprises a T-based delay circuit for delaying the second data series to compensate for time elapsed in generation of the sample selected series.

15. The device of claim 13, further comprising a T-based delay circuit configured to delay the third strobe series in order to compensate for a difference receiving each of bits of the data signal.

16. The device of claim 13, wherein the edge detector circuit detects the edge information by applying the XOR operation on consecutive signals of the first strobe series.

17. The device of claim 13, wherein the retiming is performed to retime all the signals of a series to a particular phase of a multiphase clock.

18. The device of claim 13, wherein the edge adjuster circuit performs the adjustment by determining the toggling states of first and last signal of the second strobe series, checking whether the first and the last signal of the second strobe series toggle simultaneously or independently, and, accordingly, shifting the sampling window of either a former or a latter half of the signals of the second strobe series to a next sampling window.

19. The device of claim 13, wherein the sample adjuster circuit performs the adjustment by determining toggling states of the (n/2−1)th and the (n/2)th signal of the sample selected series, checking whether the (n/2−1)th and the (n/2)th signal of the sample selected series toggle simultaneously or independently, and accordingly shifting the sampling window of either a former or latter half of the signals of the second data series to a next sampling window.

20. The device as claimed in of claim 13, wherein the linear shifting is performed as per relation below:

If$(EDD+(n)/2) < n$ then $M = EDD+(n)/2$

Else if$(EDD+(n)/2) > n-1$ then $M = EDD-n/2$[next cycle data]

where 'M' represents the sample location upon shifting.

21. The device of claim 13, further comprising a De-skew circuit configured to calculate an offset corresponding to the mismatch among bits of the data signal.

22. The device of claim 21, further comprising a De-skew mapper circuit configured to add/subtract the offset from the signals of the third strobe series.

23. The device of claim 21, wherein the De-skew circuit further comprises:

an edge detector de-skew circuit configured to determine edge information of the first data series;

an averaging circuit configured to calculate static values of the third strobe signal;

an adder/substractor circuit configured to calculate offset between the edge information of the first data series and the static values of the third strobe signal; and a register configured to store the offset.

24. The device of claim 23, wherein the De-skew circuit further comprises a decoder circuit configured to convert the edge information of the first data series to smaller bit information series.

25. The device of claim 23, wherein the offset is calculated and stored during training.

26. A method for performing read operation in a DDR memory system, comprising:

receiving a data signal and a strobe signal at a DDR PHY;

oversampling the data signal and the strobe signal with a multiphase clock having N phases to generate a series of data signals and a series of strobe signals representing a first data series and a first strobe series respectively;

generating a second strobe series by edge detection of the first strobe series followed by returning of the edge detected series, wherein the edge detection is performed by an XOR operation on consecutive signals of the first strobe series and retiming is performed to retime all the signals of a series to a particular phase of the multiphase clock;

generating a third strobe series by edge adjustment of the second strobe series, wherein the edge adjustment ensures that there are no overlapping edges among the signals of the third strobe series;

offsetting the signals of the third strobe series to compensate for a mismatch among individual bits of the data signal, wherein the offset is calculated by performing edge detection of the oversampled data signal and the oversampled strobe signal and determining a difference between the edge detected data and the edge detected strobe signal;

generating a sample selected series by linear shifting of each signal of the third strobe series by n/2, wherein the linear shifting maps each signal of the third strobe series to a corresponding middle signal upon shifting by n/2;

generating a second data series by retiming and delaying the first data series, wherein the retiming is performed to retime all the signals of a series to any phase of the multiphase clock;

generating a third data series by sample adjustment of the second data series, wherein the sample adjustment ensures that the third data series is in synchronization with a sampling window of the sample selected series; and determining a final data signal by multiplexing the third data series with the sample selected series.

* * * * *

UNITED STATES PATENT AND TRADEMARK OFFICE
CERTIFICATE OF CORRECTION

PATENT NO. : 9,147,463 B1
APPLICATION NO. : 14/224115
DATED : September 29, 2015
INVENTOR(S) : Dinakar Venkata Sarraju et al.

Page 1 of 1

It is certified that error appears in the above-identified patent and that said Letters Patent is hereby corrected as shown below:

In the Claims:

At column 16, claim number 26, line number 21, the word "returning" should read --retiming--.

Signed and Sealed this
Twenty-first Day of June, 2016

Michelle K. Lee
*Director of the United States Patent and Trademark Office*